United States Patent
Ogura et al.

(10) Patent No.: US 8,107,300 B2
(45) Date of Patent: Jan. 31, 2012

(54) NON-VOLATILE SEMICONDUCTOR MEMORY DEVICE COMPRISING CAPACITIVE COUPLING PROGRAM INHIBIT CIRCUITRY

(75) Inventors: Taku Ogura, Amagasaki (JP); Natsuo Ajika, Amagasaki (JP)

(73) Assignee: Genusion, Inc., Hyogo (JP)

( * ) Notice: Subject to any disclaimer, the term of this patent is extended or adjusted under 35 U.S.C. 154(b) by 466 days.

(21) Appl. No.: 12/025,566

(22) Filed: Feb. 4, 2008

(65) Prior Publication Data

US 2008/0186766 A1 Aug. 7, 2008

(30) Foreign Application Priority Data

Feb. 6, 2007 (JP) .................................. 2007-027347

(51) Int. Cl.
G11C 11/34 (2006.01)
(52) U.S. Cl. ......... 365/185.26; 365/185.13; 365/185.14; 365/185.18; 365/185.23; 365/185.27; 365/185.33
(58) Field of Classification Search ............. 365/185.26, 365/185.13, 185.14, 185.18, 185.23, 185.27, 365/185.33
See application file for complete search history.

(56) References Cited

U.S. PATENT DOCUMENTS

| | | | |
|---|---|---|---|
| 5,745,417 A | 4/1998 | Kobayashi et al. | |
| 5,898,606 A | 4/1999 | Kobayashi et al. | |
| 7,385,848 B2 * | 6/2008 | Iwata et al. | 365/185.21 |
| 7,612,411 B2 * | 11/2009 | Walker | 257/368 |
| 7,629,638 B2 * | 12/2009 | Yaegashi | 257/316 |
| 7,633,114 B2 * | 12/2009 | Georgescu | 257/315 |
| 7,663,179 B2 * | 2/2010 | Shinohara et al. | 257/316 |
| 7,718,474 B2 * | 5/2010 | Miyazaki et al. | 438/142 |
| 2005/0111262 A1 * | 5/2005 | Huang et al. | 365/185.28 |
| 2005/0258492 A1 * | 11/2005 | Chaudhry et al. | 257/369 |
| 2007/0230251 A1 * | 10/2007 | Ajika et al. | 365/185.23 |

FOREIGN PATENT DOCUMENTS

| | | |
|---|---|---|
| JP | 2006-128594 A | 5/2006 |
| JP | 2006-156925 A | 6/2006 |
| JP | 2006-269697 A | 10/2006 |

OTHER PUBLICATIONS

Natsuo Ajika, Shouji Sukuri, Kasuo Kobayashi, Masaaki Mihara, Youshiki Kawajiri, Development of Flash memory written at 100 MB/s Enabling NOR-level Fast Readout, Nikkei Electronics. Nov. 6, 2006, pp. 137-148.

* cited by examiner

Primary Examiner — Fernando Hidalgo
(74) Attorney, Agent, or Firm — The Marbury Law Group PLLC

(57) ABSTRACT

According to an one aspect of the present invention, it is provided a non-volatile semiconductor memory device comprising: a first N type well; a plurality of P type non-volatile memory cells arranged in matrix and formed in the N type well; a plurality of sub-bit lines, each of the sub-bit lines being connected to drains of the P type non-volatile memory cells in a respective one of columns of the matrix; a first P type well; and a plurality of N type selection transistors, each of the selection transistors selectively connecting a respective one of sub-bit lines to a corresponding one of main bit lines.

12 Claims, 29 Drawing Sheets

NON-VOLATILE SEMICONDUCTOR MEMORY DEVICE COMPRISING CAPACITIVE COUPLING PROGRAM INHIBIT CIRCUITRY

FIELD OF THE INVENTION

This invention relates to an electrically programmable and erasable non-volatile semiconductor memory device.

BACKGROUND OF THE INVENTION

Conventionally, a NAND type flash memory and a NOR type flash memory which can program and erase, are widely adopted in a non-volatile semiconductor memory device. Recently, there have been greater demands for an increase in speed of the program operation in not only a NAND type flash memory but also in a NOR type flash memory. In a conventional NOR type flash memory, an N channel type transistor is adopted. The N channel type transistor of the NOR type flash memory conducts a program operation by CHE (Channel Hot Electron) injection. However, the number of memory cells which could be simultaneously programmed in a program operation by CHE injection could not be increased. The number of memory cells at the time of program operation could not be increased due to a memory cell current which flowed at a few hundred μA and it was difficult to improve a program throughput. Also, there is need to apply a high level voltage of about 4V between the source and the drain in the memory cell transistor. And with the application of the high voltage, a problem is created where there is limit to the miniaturization of a gate length direction.

In order to solve these problems, the inventors of the present invention have already proposed a program technology which adopts an electron injection method as cited in, for example, Japan Laid Open Patent 2006-156925. This technology provides a P channel type cell transistor programmed by a band to band tunnel (below referred to as BTBT) phenomenon instead of CHE injection in a program operation.

FIG. 1 is a circuit diagram which shows one block in a conventional non-volatile semiconductor memory device. FIG. 2 is a cross section drawing of a bit line direction in a conventional non-volatile semiconductor memory device. The memory cells MC00a, ..., MCn0a, MC00b, ..., MCn0b, MC01a, ..., MCna, MC01b, ..., MCn1b which are P channel type transistors and the selection transistors ST0a, ST1a, ST0b, ST1b are formed within the same N well region in a conventional non-volatile semiconductor memory device. The N well region is separated into each block. Within one block, two sub bit lines SBL0a, SBL1a, ..., SBL0b, SBL1b, ... are connected to each main bit line MBL0, MBL1, ....

FIG. 3 shows a timing diagram during a conventional program operation. FIG. 3 is made to correspond to the operation during program of the memory cell MCn0a in FIG. 1

First, in FIG. 3, at the time t1 the operation during program of the memory cell MCn0a, the word lines WL<0>, ..., WL<n>, the main bit lines MBL0, MLB1, ..., the selection gates SGa, SGb, a source line SL and the N well region are all set at a voltage Vcc. Next, at the time t2, the voltage of the selected word line WL<0> is boosted from Vcc to VPwl. The voltage of the N well region of the memory cell MCn0a is boosted from Vcc to VPnwell. Also, the voltage of the selection gate SGa of the memory cell MCn0a is lowered from Vcc to VNsg. At this time, the selection transistors ST0a and ST1a in the selection gate SGa are ON. The voltage of the sub bit lines SBL0a and SBL1a becomes Vcc, the same voltage as of the main bit lines MBL0 and MBL1.

On the other hand, the selection transistors ST0b and ST1b in the unselected selection gate SGb are connected to the sub bit lines SBL0b and SBL1b. The voltage of the sub bit lines SBL0b and SBL1b is boosted by the capacitive coupling of the N well region and the memory drain junctions. However, the boost level of the capacitive coupling is cramped by the voltage Vcc+|Vthp| which may be the conducting level of the selection transistors ST0b and ST1b. Here, the voltage Vthp is the threshold voltage of the selection transistors ST0b and ST1b. At the time t3, when a "0" data program is done to the cell MCn0a, the voltage of the main word line MBL0 becomes 0V from Vcc. The sub bit line SBL0a is connected to the drain of the memory cell MCn0a which is to be programmed. The voltage of the sub bit line SBL0a becomes 0V.

At this time, the word line WL of the selected memory cell MCn0a for programming is at VPwl. The drain of the memory cell MCn0a is at 0V. The source line SL is at Vcc. The N well region of the memory cell MCn0a is at VPnwell. As a result, the electrons in the BTBT current which occurs around the area of the drain of the memory cell MCn0a are accelerated toward the channel direction. The electrons are attracted to the side of the word line which is applied with a positive voltage VPwl. As a result, electrons are injected into a floating gate of the memory cell MCn0a. This is the program operation of the memory cell MCn0a. After this, at the time t4, the program operation is finished by returning the voltage of the main bit line MBL0 of the memory cell MCn0a to Vcc. At the time t5, each voltage of the memory cell MCn0a is returned to its initial state.

This technology is described in Japanese laid open patents 2006-156925, 2006-128594 and 2006-259697 and Ajika et al., "A Flash Memory Programmed at 100 MByte/second is Developed", Nikkei Electronics No. 938, pp 137-148 (2006).

By the proposal stated above of the inventors, it is possible, in a non-volatile semiconductor memory device, the voltage applied between a source and a drain of a memory cell transistor is reduced when compared with the voltage applied between a source and a drain of a conventional memory cell transistor. However, the problem of disturbance is likely to occur in the unselected memory cell transistor during program operation. The problem of disturbance occurs particularly on the memory cell transistor which is connected to an unselected bit line and a selected word line. In other words, it is strongly desired to provide a method, wherein a high voltage is not applied between the source and drain, a required voltage for a program operation is applied between the source and drain of the memory cell to be programmed, and a program inhibit voltage of a level where disturbance does not become a problem is selectively and efficiently applied.

For example, a disturbance problem in a program operation in a conventional example shown in FIG. 1 will be described. Memory cell transistors other than the memory cell transistor MCn0a to be programmed suffer from the disturbance. Specifically, the memory cell transistors MCn0b, MCn1a, MCn1b ... which are not the cell to be programmed are located along the word line which is the selected word line WL<n>. There is a great danger that a disturbance problem will occur in the memory cell transistors MCn0b, MCn1a, MCn1b ... which are not to be programmed. A disturbance problem occurs when the drain voltage of the unselected memory cell transistor MCn1a which connected to the same selection gate SGa and is connected to the sub bit line SBL1a is at Vcc. The drain voltage of the memory cell transistor MCn0a which is to be programmed is at 0V. This is because the voltage difference between the drain voltage of the memory cell transistor MCn1a which is not to be programmed and the drain voltage of the memory cell transistor MCn0a is only Vcc. Here, if the drain voltage Vcc of the memory cell transistor MCn1a, which is not to be programmed, is a low voltage, then a problem occurs where selectivity becomes worse. For example, when Vcc is 1.8V, there is a need to control the program selection or non selection (inhibit) by this 1.8V voltage difference.

Also, similarly, the voltage which is applied to the source of the memory cell transistor MCn1a which is not to be programmed is also Vcc. The same disturbance problem as the drain occurs in the source side. Because of this, there is need to secure sufficient selectivity against program disturbance which occurs in the source side.

On the other hand, because the drain voltage of the memory cell transistors MCn0b, MCn1b which are connected to SBL0b, SBL1b which are selected by the selection gate SGb which is different to the selection gate SGa which the selected memory cell transistor MCn0a is connected, is boosted up to Vcc+|Vthp| by capacitive coupling between the N type well region and the junction of the drain of the memory cell transistor, therefore, the drain voltage of the memory cell transistors MCn0b and MCn1b becomes a higher level than Vcc. However, across the entire non-volatile semiconductor memory device, the memory cell transistor which is connected to the sub bit line which is selected by the same selection gate as the memory cell transistor which is selected, receives the strongest disturbance. Therefore, disturbance characteristics are not sufficient.

As stated above, in order to improve disturbance characteristic during programming, there is a need to increase selectivity by making the drain voltage of the non-programming memory cell higher than Vcc. However, when a method of charging by a high voltage from the side of the main bit line MBL is adopted, a loss in consumption energy and high voltage setup time occurs. This is because there is a need to charge a voltage which is not to be programmed to all the main bit lines MBL. Also, according to this method, in the case where a main/sub bit line construction is adopted in which a plurality of sub bit lines SBL are connected to one main bit line MBL as shown in FIG. 1, a problem occurs whereby the above stated voltage cannot be applied to the cell connected to the same main bit line MBL. Therefore, by a method other than the method stated above, it is strongly desired that the voltage between the source and the drain of the memory cell transistor which is to be programmed continue to be controlled and be made higher than only the drain voltage Vcc of the non-programming memory cell. The improvement of the program disturbance which occurs on the source side is also demanded.

It is the prime object of the present invention to provide a non-volatile semiconductor memory device to overcome the above mentioned problems. However, other object of the present invention will be well described in the forgoing descriptions.

SUMMARY OF THE INVENTION

According to an one aspect of the present invention, it is provided a non-volatile semiconductor memory device comprising: a first N type well; a plurality of P type non-volatile memory cells arranged in matrix and formed in the N type well; a plurality of sub-bit lines, each of the sub-bit lines being connected to drains of the P type non-volatile memory cells in a respective one of columns of the matrix; a first P type well; and a plurality of N type selection transistors, each of the selection transistors selectively connecting a respective one of sub-bit lines to a corresponding one of main bit lines.

The non-volatile semiconductor memory device according the present invention may further comprise a source line; and a plurality of P type pre-charging transistors formed in the N type well, the P type pre-charging transistors selectively connecting a respective one of the sub-bit lines to the source line. The plurality of P type pre-charging transistors may be arranged along one end of said N type well. Each of the P type non-volatile memory cells may include a charge accumulation layer made of nano-crystal layer or silicon nitride layer.

The plurality of P type pre-charging transistors may consist of a first group P type pre-charging transistors and a second group P type pre-charging transistors, the first group P type pre-charging transistors are arranged along one end of the N type well and the second group P type pre-charging transistors are arranged along another end of the N type well.

The non-volatile semiconductor memory device according to Claim 1 wherein each of the P type non-volatile memory cells includes a charge accumulation layer made of nano-crystal layer or silicon nitride layer.

Each of the P type non-volatile memory cells may include a floating gate and a control gate, and each of the selection transistors includes a first gate which is the same layer as the floating gate and a second gate which is the same layer as the control gate, the first gate and the second gate being electrically connected through via hole.

Each of the P type non-volatile memory cells may include a floating gate and a control gate, and each of the P type pre-charging transistors includes a first gate which is the same layer as the floating gate and a second gate which is the same layer as the control gate, the first gate and the second gate being electrically connected through via hole.

Each of the P type non-volatile memory cells may include a drain connected to a respective one of the sub-bit lines and a source connected to a source line, the drain and the source being so asymmetrically designed that electron injections to a charge accumulation layer are different between at the drain and at the source.

The drain may include a first diffusion region and the source may include a second diffusion region, diffusion concentrations of the first diffusion region being greater than of the second diffusion region.

The non-volatile semiconductor memory device of the present invention may further comprise: a selection transistor bias circuit to provide a first voltage to gate electrodes of the plurality of N type selection transistors, thereby to float the sub-bit lines; a word line bias circuit to provide a second voltage to a selected one of word lines, each of the word lines being connected to control gates of the P type non-volatile memory cells in a corresponding row; and a well bias circuit to provide a third voltage greater than the first voltage to the first N type well, thereby to boost the sub-bit lines beyond a level of the first voltage partially by capacitive coupling between the N type well and drains of the plurality of P type non-volatile memory cells.

The non-volatile semiconductor memory device of the present invention may further comprise: a bit line bias circuit to selectively provide a programming voltage lower than the first voltage to a respective one of the main bit lines, thereby to discharge a corresponding one of the sub-bit lines through corresponding one of the N type selection transistors.

The non-volatile semiconductor memory device of the present invention may further comprise: a source voltage bias circuit to provide an inhibit voltage to the source line; and a pre-charging transistor bias circuit to turn on the plurality of N type selection transistors, thereby to pre-charge the sub-bit lines to the inhibit voltage.

The non-volatile semiconductor memory device of the present invention may further comprise: an internal inhibit voltage generation circuit including a charge pumping circuit to generate the inhibit voltage from externally supplied voltage, the internal inhibit voltage generation circuit being connected to the source voltage bias circuit.

According to another aspect of the present invention, it is provided a non-volatile semiconductor memory device comprising: a P type non-volatile memory cell formed in an N type well, the P type non-volatile memory cell including a source, a drain, a charge accumulation layer and a control gate; a sub-bit line connected to the drain of the P type non-volatile memory cell; an N type selection transistor including a source, a drain and a control gate, the drain of the N type selection transistor being connected to the sub-bit line; and a well bias circuit to bias the N type well with a first voltage so that the sub-bit line is floated and boosted to a program inhibit voltage by a capacitive coupling between the N type well and the drain of the P type non-volatile memory cell.

The P type non-volatile memory cell may be programmed by applying a word line voltage to the control gate of the P type non-volatile memory and by applying a programming voltage to the source of the N type selection transistor, so that the sub-bit line is discharged to the programming voltage by the N type selection transistor and electrons are injected from the drain of the P type non-volatile memory cell into the charge accumulation layer of the P type non-volatile memory cell.

The source of the P type non-volatile memory cell may be biased with Vcc which is an externally supplied power supply voltage and the first voltage is internally generated by a charge pump circuit from the Vcc.

The N type selection transistor may be formed in a P type well, and the N type well and the P type well may be arranged adjacent to each other.

According to still another aspect of the present invention, it is provided a non-volatile semiconductor memory device comprising: first and second P type non-volatile memory cells each formed in an N type well, each of the first and second P type non-volatile memory cells including a source, a drain, a charge accumulation layer and a control gate; a sub-bit line connected to the drain of the first P type non-volatile memory cell and the drain of the second P type non-volatile memory cell; an N type selection transistor including a source, a drain and a control gate, the drain of the N type selection transistor being connected to the sub-bit line; and a source line connected to the source of the first P type non-volatile memory cell and the source of the second P type non-volatile memory cell; and a source line bias circuit to bias the source line with a program inhibit voltage so that the sub-bit line is biased to the program inhibit voltage by turning on the second P type non-volatile memory cell.

The first P type non-volatile memory cell may be programmed by applying a word line voltage to the control gate of the first P type non-volatile memory, by applying a first voltage to the N type well, and by applying a programming voltage to the source of the N type selection transistor, so that the sub-bit line is discharged to the programming voltage by the N type selection transistor and electrons are injected from the drain of the first P type non-volatile memory cell into the charge accumulation layer of the first P type non-volatile memory cell.

The source of the first P type non-volatile memory cell may be biased with Vcc which is an externally supplied power supply voltage and the first voltage is internally generated by a charge pump circuit from the Vcc.

The N type selection transistor may be formed in a P type well, and the N type well and the P type well may be arranged adjacent to each other.

According to still another aspect of the present invention, it is provided a non-volatile semiconductor memory device comprising: a P type non-volatile memory cell formed in an N type well, the P type non-volatile memory cell including a source, a drain, a charge accumulation layer and a control gate; a sub-bit line connected to the drain of the P type non-volatile memory cell; an N type selection transistor including a source, a drain and a control gate, the drain of the N type selection transistor being connected to the sub-bit line; a source line; a source line bias circuit to bias the source line with a program inhibit voltage; and a P type pre-charging transistor formed in the N type well for connecting the source line and the sub-bit line to pre-charge the sub-bit line to the program inhibit voltage and for disconnecting the sub-bit line from the source line so that the sub-bit line is floated.

The P type non-volatile memory cell may be programmed by applying a word line voltage to the control gate of the P type non-volatile memory, by applying a first voltage to the N type well, and by applying a programming voltage to the source of the N type selection transistor, so that the sub-bit line is discharged to the programming voltage by the N type selection transistor and electrons are injected from the drain of the P type non-volatile memory cell into the charge accumulation layer of the P type non-volatile memory cell.

The source of the P type non-volatile memory cell may be biased with Vcc which is an externally supplied power supply voltage and the first voltage may be internally generated by a charge pump circuit from the Vcc.

The N type selection transistor is formed in a P type well, and the N type well and the P type well may be arranged adjacent to each other.

According to the present invention, a selection transistor is changed to an N channel type transistor from a conventional P channel type transistor. The drain voltage of a non-programming memory cell is made to be higher than Vcc in the N channel type transistor. It becomes possible to selectively make only the selection transistor which selects a sub bit line which is connected to the unselected non-programming memory cell, OFF. As a result, it is possible to maintain a high voltage of the program inhibit voltage. Further, it becomes necessary to separate the well between the memory cell region and the selection transistor region. Even for a conventional technology, it is necessary to separate the well regions for different blocks, therefore, area penalty, in particular, does not occur in this invention.

In addition, because the voltage boosted by the capacitive coupling is used as a drain voltage of the non-programming memory cell, it becomes possible to obtain the above stated effects even within a device which has a comparatively simple construction.

Also, in the non-programming memory cell, a high voltage which is generated within a chip, supplied with a voltage from the source side is used as a drain voltage of the memory cell transistor not to be programmed, voltages are well controlled. Further, in the case where a high voltage is generated by a charge pump circuit within a chip, only the source line of one block is charged. In order to supply a high voltage by a charge pump circuit within a chip, the current consumption problem or the problem of high voltage setup time must substantially not be allowed to occur.

In order to supply a high voltage from the source line side, two methods can be used. Firstly, a memory cell channel along the non selected word line (unselected word line WL) can be used. Secondly, It is possible to use a channel of a dedicated pre-charge P channel type transistor which is placed at the end of a block.

According to the present invention, in the non-volatile semiconductor memory device, even at the time when a voltage between the source and the drain of a memory cell transistor which is to be programmed is lowered, it is possible to set the drain voltage of a non-programming memory cell higher than Vcc. Therefore, it is possible to make the voltage difference between the drain voltage of the memory cell transistor which is to be programmed and the drain voltage of the non-programming memory cell, greater. As a result, in the non-volatile semiconductor memory device, it is possible to improve the disturb margin at the time of programming. Also, because it is possible to control the voltage between the source and drain of a memory cell transistor it is also possible to realize the miniaturization of the gate length direction of a memory cell transistor.

In addition, according to this invention, by making the construction of the source side into a construction where, compared to the drain side, it is difficult to program, it is possible to effectively control suppress and reduce program disturbance which occurs on the source side.

According to still another aspect of the present invention, it is provided a non-volatile semiconductor memory device comprising: an N type well for a plurality of memory cells formed within, the N type well being biased by an N well bias voltage though a first number (N1) of contacts; and a P type well for a plurality of selection transistors formed within, the P type well being biased by a P well bias voltage though a second number (N2) of contacts; wherein the first number (N1) is greater than the second number (N2).

The N type active region loop may be surrounding the plurality of memory cells.

The surface of the N type active region loop may be formed with a salicide film to reduce resistance.

The N type well may be biased with a first voltage which is greater than externally supplied Vcc by an internal charge pump circuit.

The N type well is biased with a first voltage to enhance programming of the memory cells.

According to still another aspect of the present invention, it is provided a non-volatile semiconductor memory device comprising: a first memory block having a plurality of P type memory cells arranged in matrix shape formed in a first N type well; a second memory block having a plurality of P type memory cells arranged in matrix shape formed in a second N type well; and a plurality of selection transistors formed between the first N type well and the second N type well.

Each of the selection transistors may have greater gate width than the P type memory cells.

Each of the selection transistors may have greater gate length than the P type memory cells.

Each of the selection transistors may be of N type MIS transistors formed in a P type well.

The non-volatile semiconductor memory device may further comprise: a plurality of sub bit lines each of the sub bit lines being connected to corresponding P type memory cells in a column of the matrix form, the sub bit lines being arranged within the first or second memory block; and a plurality of main bit lines arranged across the first and second memory blocks; wherein two of the sub bit lines correspond to one of the main bit lines.

The first one of the selection transistors corresponding to the first memory block and the second one of selection transistors corresponding to the second memory block share sources.

The non-volatile semiconductor memory device may further comprise a plurality of sub bit lines each of the sub bit lines being connected to corresponding P type memory cells in a column of the matrix form, the sub bit lines being arranged within the first or second memory block; and a plurality of main bit lines arranged across the first and second memory blocks; wherein four of the sub bit lines correspond to one of the main bit lines.

The first one of the selection transistors corresponding to the first memory block and a second one of selection transistors corresponding to the first memory block may share sources.

According to still another aspect of the present invention, it is provided a non-volatile semiconductor memory device comprising: a memory block having a plurality of P type memory cells arranged in matrix formed in an N type well; a plurality of sub bit lines each of the sub bit lines being connected to corresponding P type memory cells in a column of the matrix; and a plurality of pre-charging transistors formed in the N type well, each of the pre-charging transistors pre-charges corresponding one of the sub bit lines with a program inhibit voltage.

Each of the P type memory cells may have a floating gate and a control gate; and each of the pre-charging transistors may have a first poly silicon gate and a second poly silicon gate electrically connected to the first poly silicon gate.

The first poly silicon gate may be separated from other one of the pre-charging transistors and is connected to the second poly silicon gate within corresponding one of the pre-charging transistors.

The first poly silicon gate and the second poly silicon gate may be connected through via hole made in an inter poly silicon insulator film.

The via hole may be partially made in the inter poly silicon insulator film.

BRIEF DESCRIPTION OF THE DRAWINGS

FIGS. 13A to 14C show alternative examples of connections between the first poly silicon layer and the second poly silicon layer of pre-charging transistors (PCG) and selection transistors (SG).

FIGS. 14A, 14B and 14C show examples to connect the second poly layer and the first poly layer.

DETAILED DESCRIPTION OF THE INVENTION

The non-volatile semiconductor device relating to a first embodiment will be explained by referring to FIG. 4A to FIG. 6.

Figure 1:
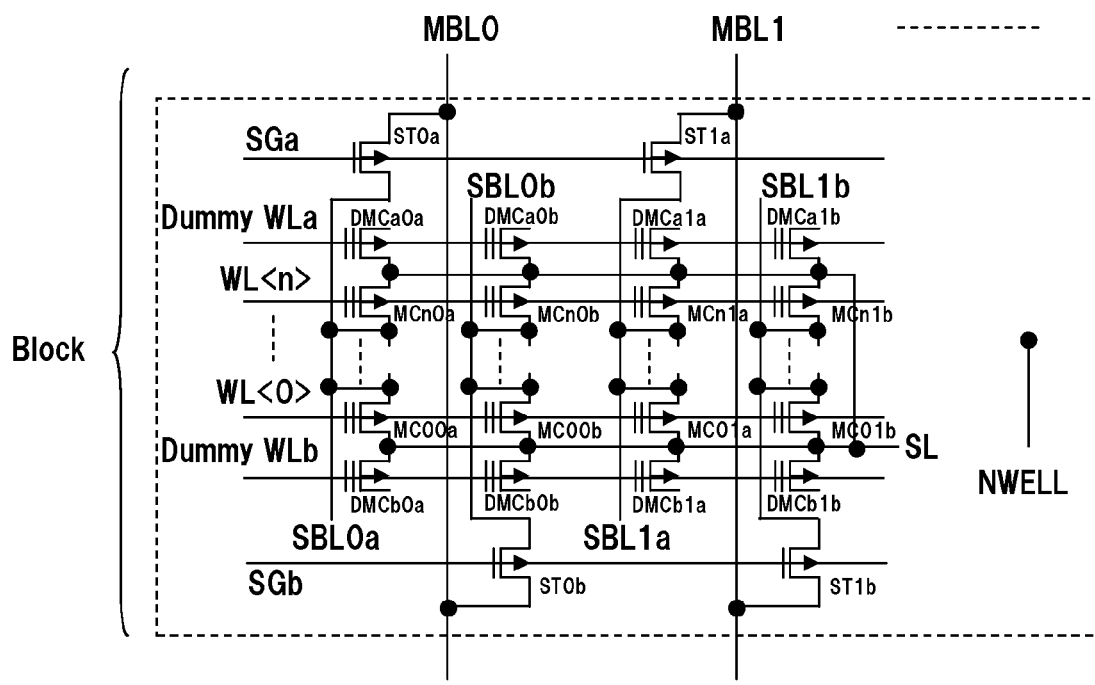
FIG. 1 is a circuit diagram which shows one block of a conventional non volatile semiconductor memory device.
Figure 2:
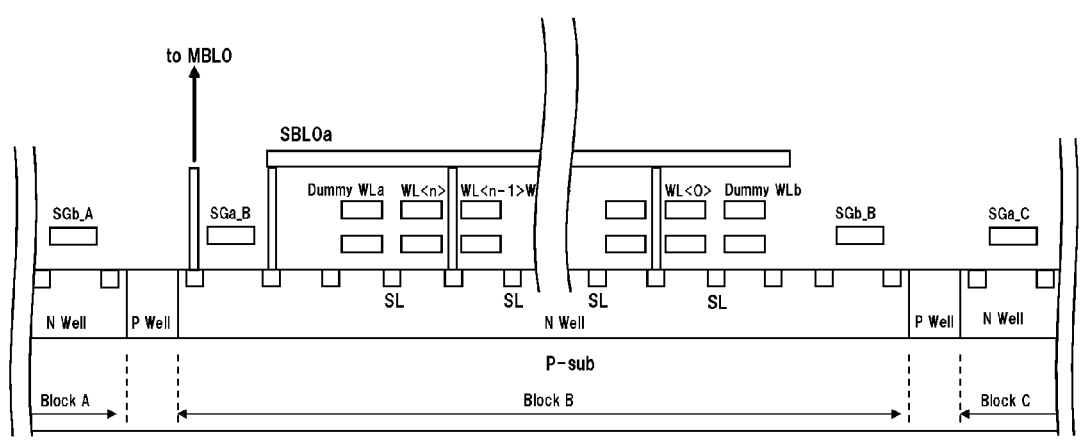
FIG. 2 is a cross sectional drawing in a bit line direction of a conventional device.
Figure 3:
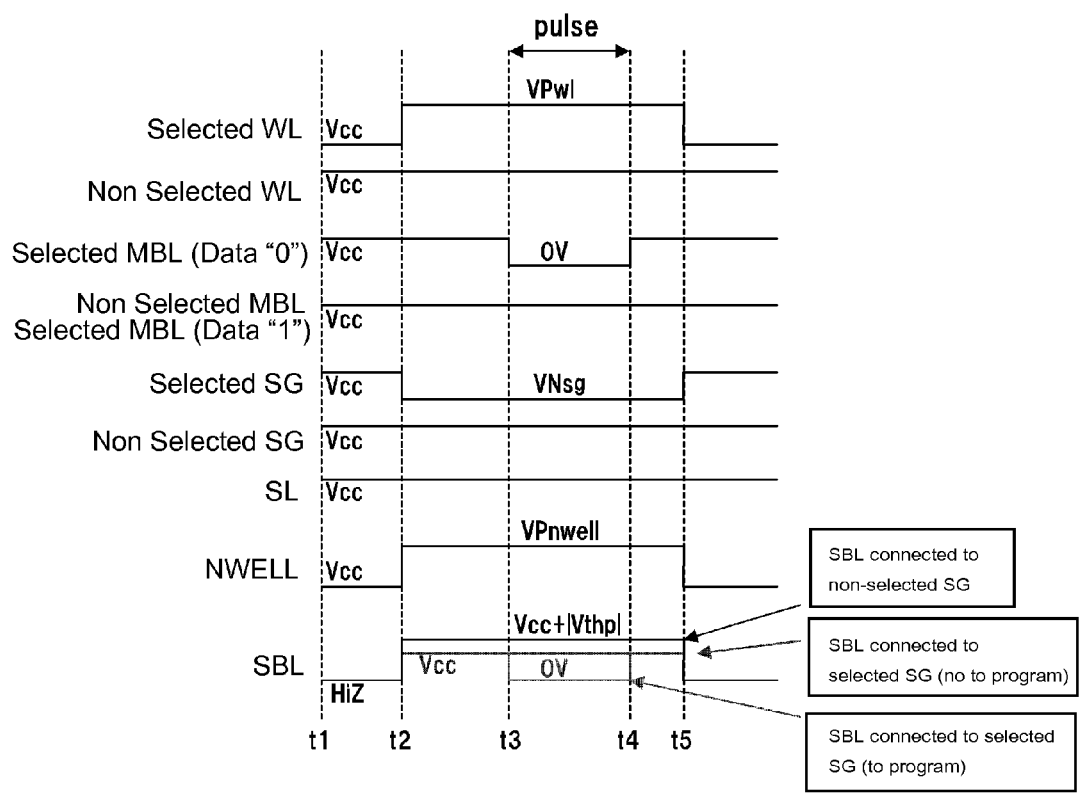
FIG. 3 is a timing diagram which shows a control method at the time of a conventional programming operation.
Figure 4A:
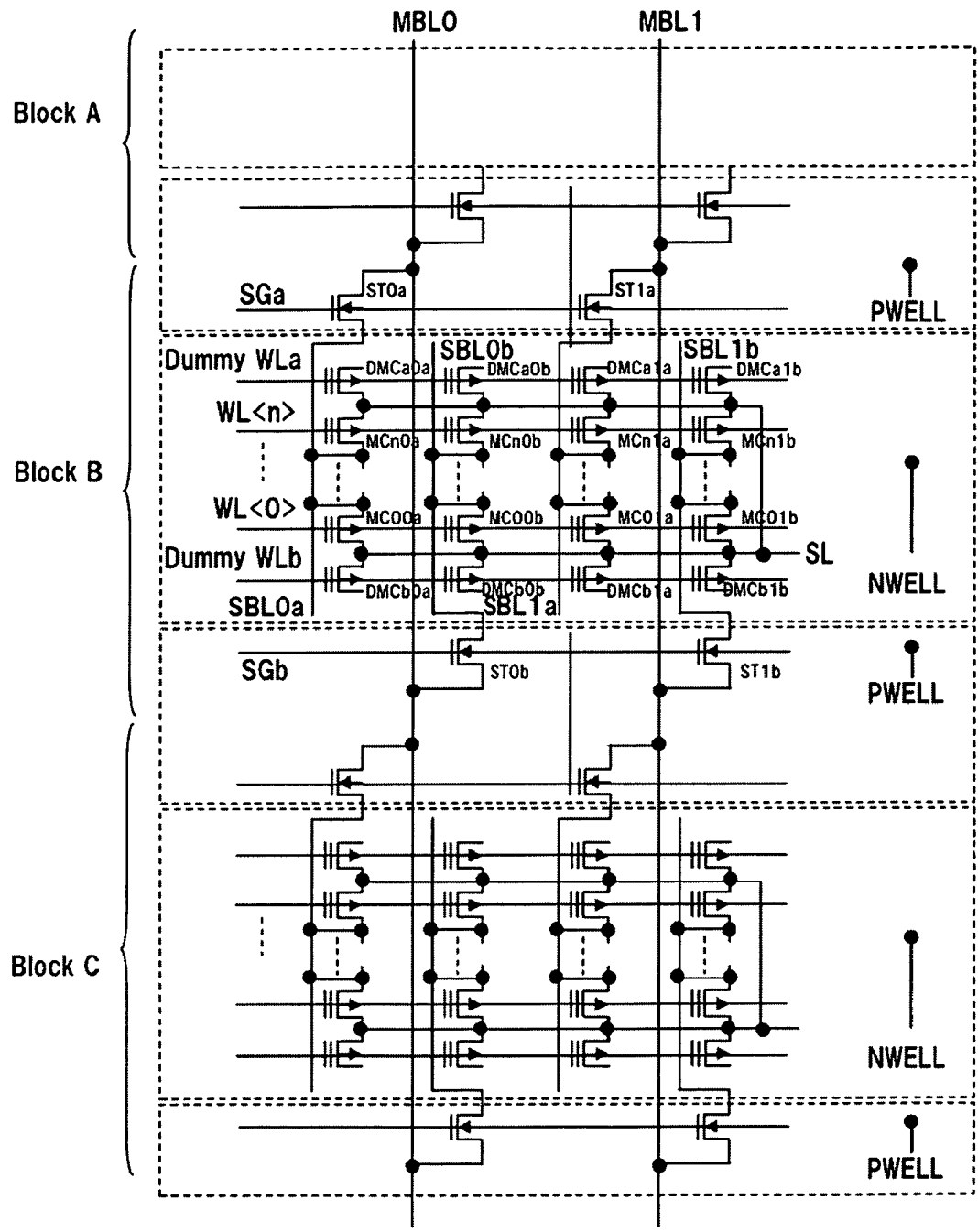
FIG. 4A is a circuit diagram which shows one block of a non volatile semiconductor memory device in the first embodiment of the present invention and FIG. 4B is a block diagram of the non-volatile semiconductor memory device.

FIG. 4A is a circuit diagram which shows plural blocks, especially a Block B which is in adjacent to Blocks A and C, in the non-volatile semiconductor memory device of the first embodiment.

Figure 4B:
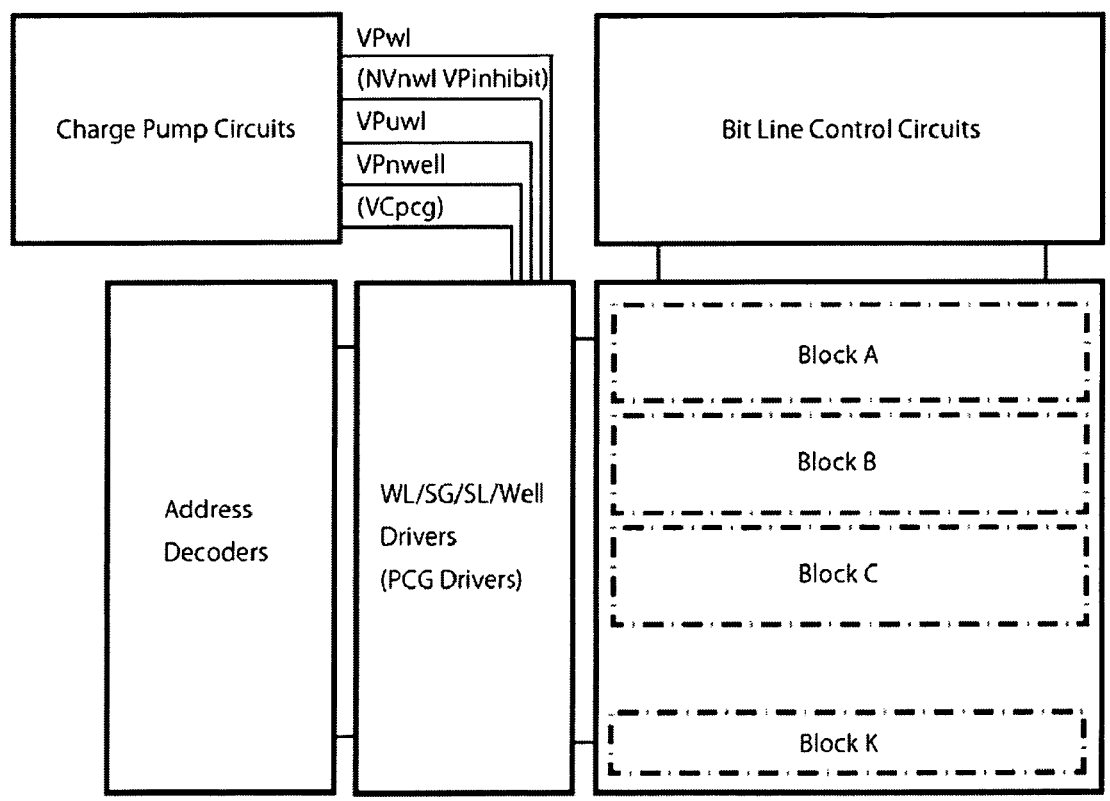

FIG. 4B shows a block diagram of the non-volatile semiconductor memory device of the first embodiment. As shown in FIG. 4B, the memory device includes a Charge Pump Circuits for generating VPwl, VPuwl, VPnwell from externally supplied Vcc; an Address Decoders for receiving externally supplied address signals and for decoding them to supply the decoded selection signals; a WL/SG/SL/Well Drivers for receiving the decoded selection signals and for driving word lines, selection gates, source lines and wells; a Bit Line Control Circuits for selectively supplying data ("0" or "1") to main bit lines; and a memory cell array having the Blocks described in FIG. 4A.

Figure 5A:
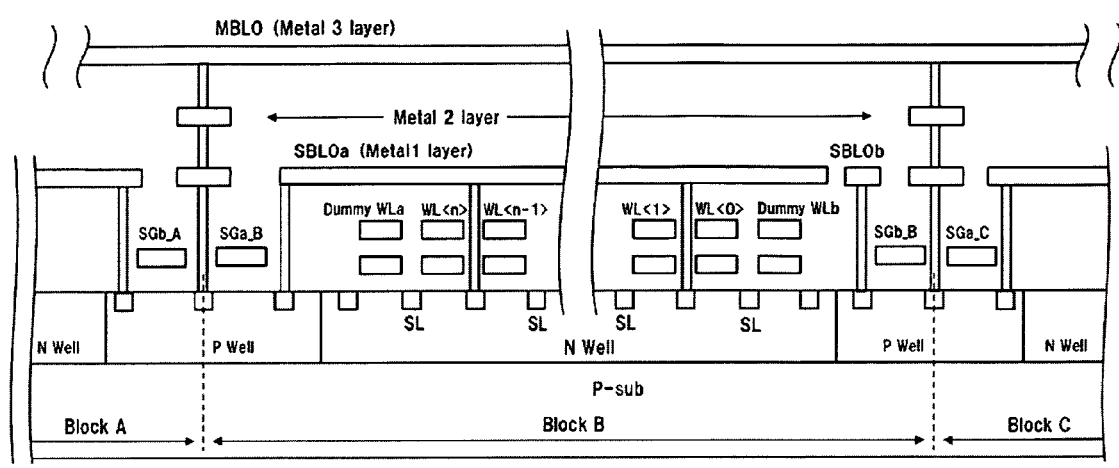
FIG. 5A is a cross sectional drawing in a bit line direction in the first embodiment of the present invention.

FIG. 5A is a cross sectional view along a bit line direction in the non-volatile semiconductor memory device. According to a construction of this non-volatile semiconductor memory device, memory cell transistors (below simply called memory cells) MC00a, . . . , MCn0a, MC00b, . . . , MCn0b, MC01a, . . . , MCna, MC01b, . . . , MCn1b, . . . which are P channel type transistors, are formed within the N type well region. Each of the memory cell transistors has a charge accumulation layer of a floating gate, however it could be possible to replace with a charge accumulation layer made of nano-crystal layer or silicon nitride layer. The N type well region is formed within the P-sub region 11 formed in the P type substrate 10. Selection transistors ST0a, ST1a, ST0b, ST1b, . . . which are N type transistors and may be single gate transistors (when the charge accumulation layer of the memory cell is made of nano-crystal layer or silicon nitride layer, then steps in the covering interlayer insulation film may not appear), are formed in the P type well regions 13 and 14. The P type well regions 13 and 14 are formed adjacent to the N type well region and are arranged both ends of the N type well region in the bit line direction. Also, in the present embodiment, two blocks (two N type wells) which are arranged in a bit line direction share a same P type well region 13 or 14 in which selection transistors for both blocks are formed. As a result, the area which the entire non-volatile semiconductor memory device occupies is reduced. While, in the present embodiment, two sub bit lines SBL0a, SBL1a, . . . , SBL0b, SBL1b are connected to each main bit line MBL0, MBL1 within one block, however, the present invention is not limited to this. For example, it is possible to bring out the substantial effects of the present invention with one or even four sub bit lines being arranged.

Figure 5B:
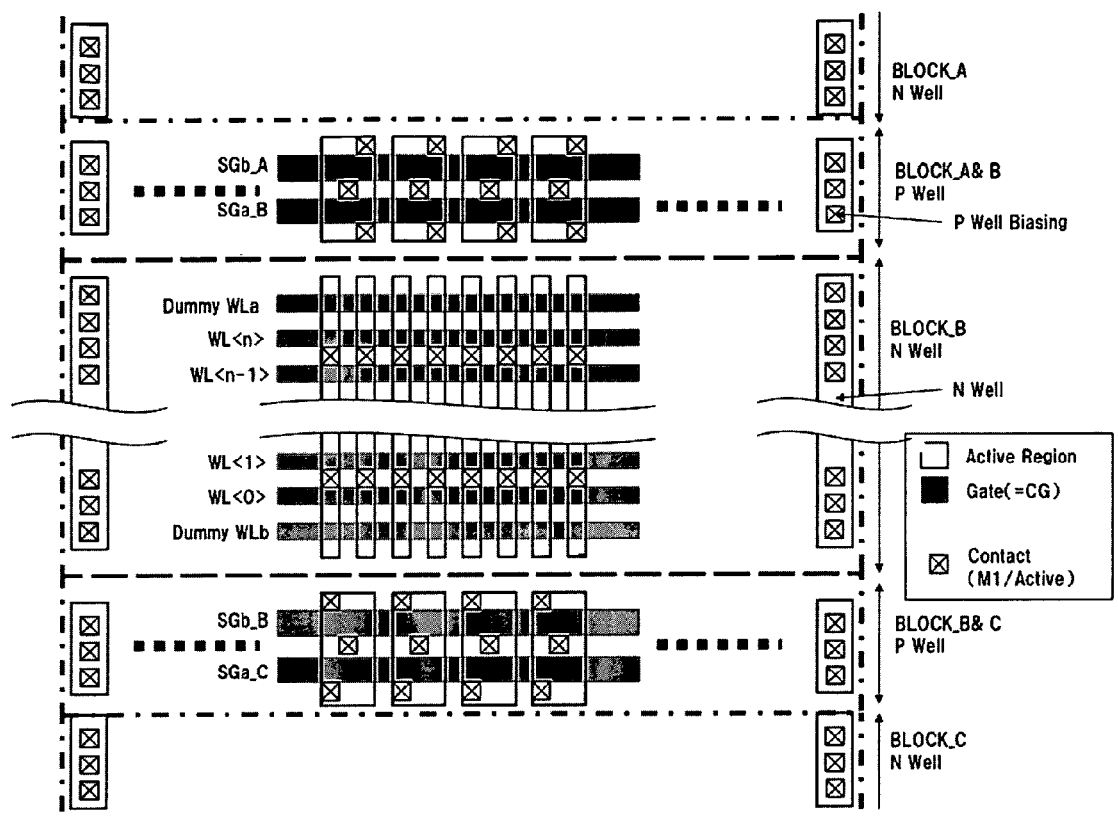
FIGS. 5B and 5C show a pattern layout of the memory cell array.
Figure 5C:
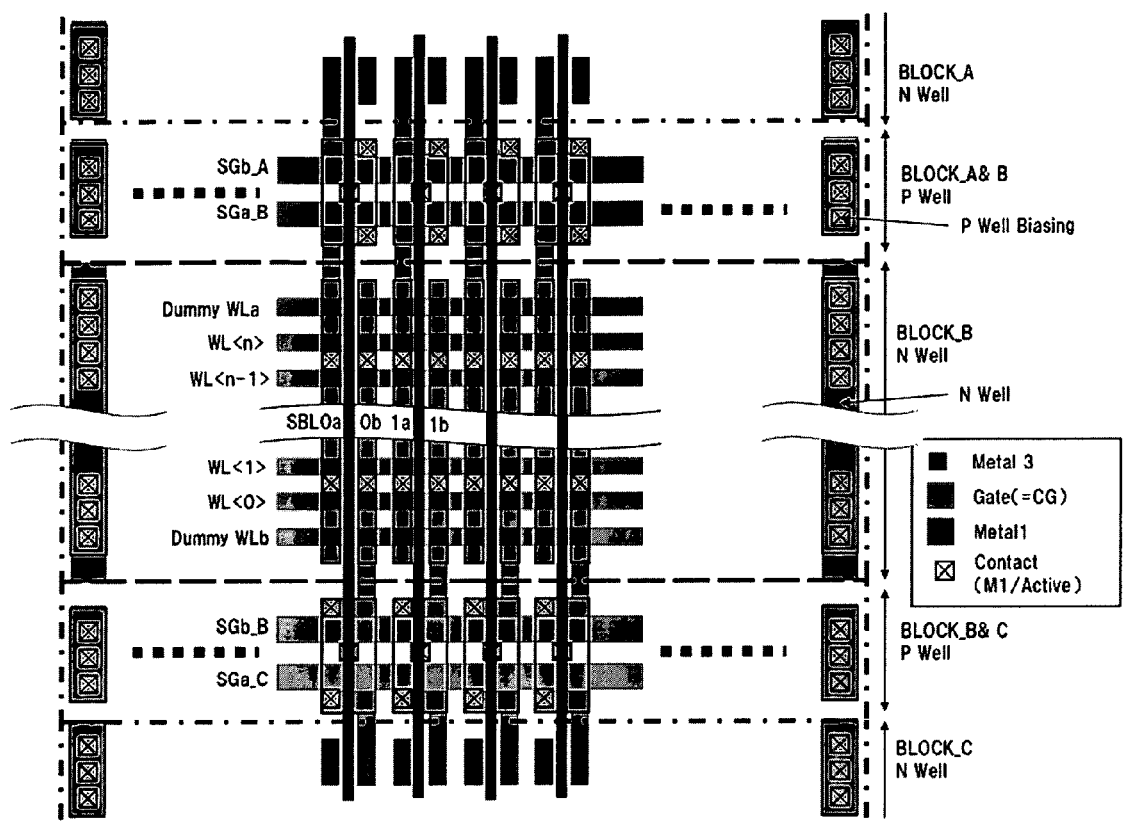

FIGS. 5B and 5C show a plan view of the memory cell array. FIG. 5B shows a layout pattern of active regions, gate pattern (the second polysilicon layer, where the first polysilicon layer for floating gate is hidden in the second polysilicon layer), and contacts for connecting the Metal 1 layer and active region. The width of the gate of selection transistors is greater than the width of gates of memory cells, which makes the operation margin better. Two selection gates for different blocks (Block A and Block B) share the sources to provide a single contact to main bit line. Active regions are arranged at both ends of wells to provide a stable biasing of well, and the active regions are connected to contacts. It should be noted that a number of contacts for well biasing arranged at N Well is greater than a number of contact for well biasing arranged at P Well for selection transistors. This arrangement of well bias contacts makes more stable operation during programming.

FIG. 5C shows a layout pattern of the Metal 1 layer and the Metal 3 layer. The wires made by Metal 2 layers which run in the direction perpendicular to the main and sub bit lines are not shown in the drawing. It should be noted that Metal 1 strips are arranged over the well biasing active regions to provide stable well bias.

Figure 5D:
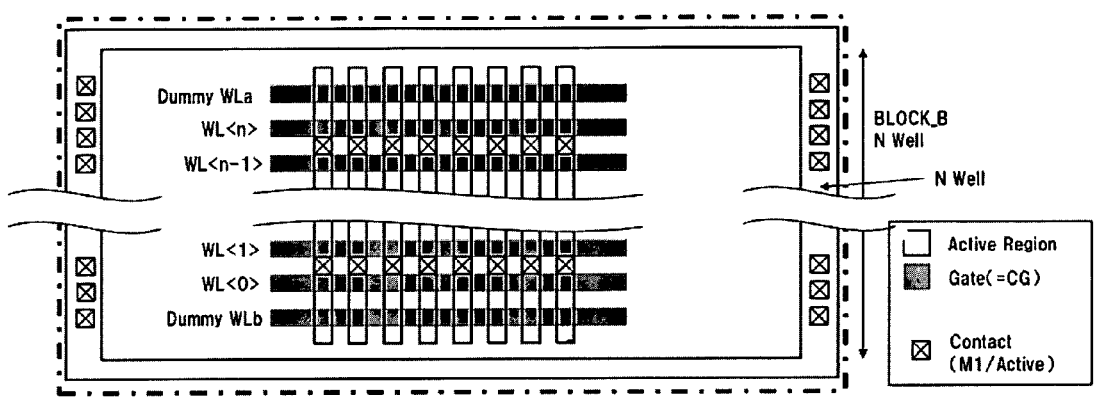
FIG. 5D show a pattern layout of active region.

It is much preferable to have local interconnects at both top and bottom of N Wells. The local inter connects may be of N+ diffusion layer with refractory metal salicide surface, for example, cobalt salicide. The local inter connection is continuous and therefore provides a active region loop surrounding the memory cell array. FIG. 5D shows a layout of active regions with the local interconnects. The active region forms a loop. The arrangement of the local interconnects will provide more stable well biasing.

Figure 6A:
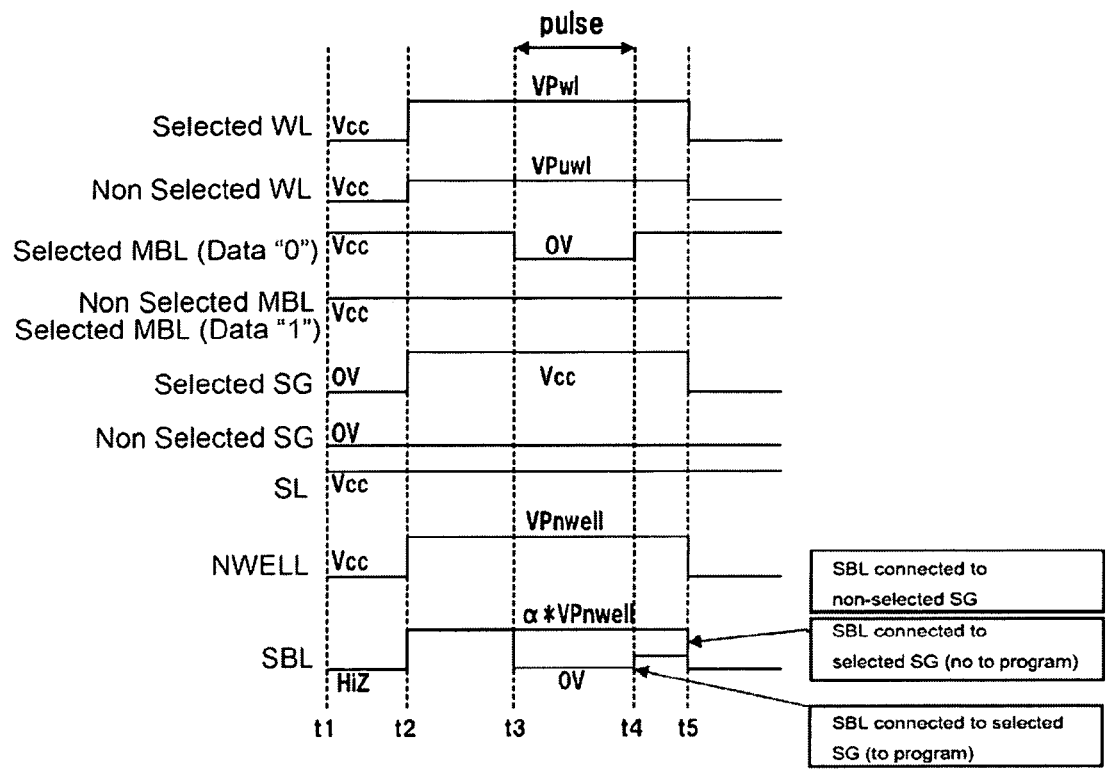
FIGS. 6A and 6B are timing diagrams which show programming operations in the first embodiment of the present invention.
Figure 6B:
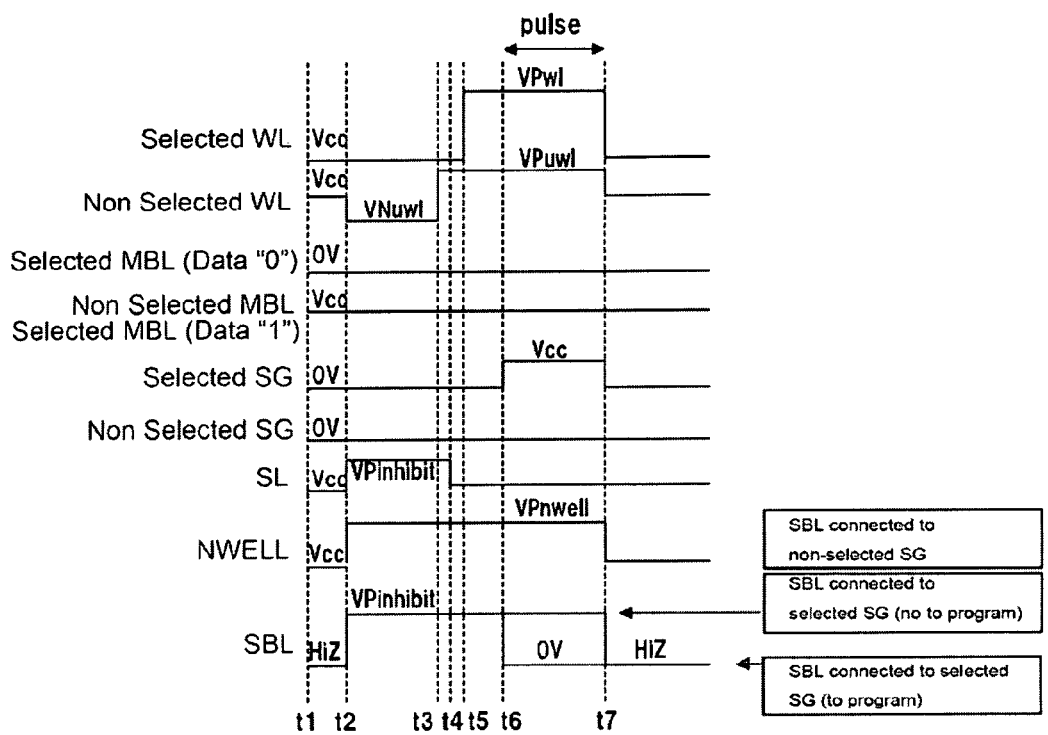

Next, a timing control at the time of a program operation in the present embodiment is shown in FIGS. 6A and 6B. Here, FIG. 6A shows an operation for programming the memory cell MCn0a in FIG. 4.

First, in the operation at the time of programming the memory cell MCn0a, at the time t1, the word lines WL<0>, . . . , WL<n>, the main bit lines MBLo, MLB1, . . . , a source line SL and the N type well region are applied with a voltage Vcc. The selection gates SGa, SGb are set at 0V. At this time, the selection transistors ST0a, ST1a, ST0b, ST1b are all in an OFF state. As a result of this, all the sub bit lines SBL0a, STL0b, SBL1a, SBL1b . . . become a floating state.

Next, at the time t2, the voltage of the selected word line WL<n> of the memory cell MCn0a is boosted from Vcc to VPwl. The voltage of the non selected word lines WL<0>, . . . , WL<n1> of the memory cell MCn0a are boosted from Vcc to VPuwl. The voltage of the N type well region of the memory cell MCn0a is boosted from Vcc to VPnwell. Further, the voltage of the selection gate SG of the memory cell MCn0a is boosted from 0V to Vcc. At this time, the selection transistors ST0a, ST1a, . . . , along the selection gate SG are ON. The voltages of the sub bit lines SBL0a, SBL1a, . . . become at Vcc-Vthn which is dropped by only the threshold voltage Vthn of the selection transistor from the voltage Vcc of the main bit lines MBL0, MBL1. Then, it becomes αVPnwell by capacitive coupling (α is a coupling coefficient). On the other hand, the voltage of the sub bit lines SBL0b, SBL1b which are connected to the selection transistors ST0b, ST1b which are along the unselected selection gate SGb, is boosted by capacitive coupling of the junction between the N type well region and the memory cell drain. The voltage of the drain potential becomes the value αVPnwell where VPnwell is multiplied with α when the coupling coefficient is α. Also, the voltage VPuwl of the non-selected word line WL (unselected word line WL), is set so that the memory cell in the unselected word line WL does not become ON.

At the time t3, the voltage of the main bit line MBL0 which is to be programmed with "0" data drops from Vcc to 0V. As a result, the voltage of the sub bit line SBL0a which is connected to the drain of the memory cell MCn0a which is to be programmed, becomes 0V. At this time, the word line of the memory cell MCn0a which is to be programmed becomes VPwl. The drain of the memory cell MCn0a (which is to be programmed) becomes 0V. The source line SL of the memory cell MCn0a (which is to be programmed) becomes Vcc. The N type well region of the memory cell MCn0a (which is to be programmed) becomes VPnwell. Therefore, the in the BTBT current which occurs near the drain of the memory cell MCn0a (which is to be programmed), electrons are accelerated in the channel direction. Electrons are extracted toward the word line which is applied with the positive voltage VPwl. Consequently, the extracted electrons are injected into the floating gate. The programming operation of the memory cell MCn0a (which is to be programmed), is carried out as described above. Then, at the time t4, the programming operation is completed by the return of the voltage of the main bit line MBL0 to Vcc. At the time t5, each voltage of the memory cell MCn0a (which is to be programmed) are returned to their initial states.

In the present embodiment, because the drain voltages applied the memory cells MCn0b, MCn1a, MCn1b . . . (which are not programmed) are all the same αVPnwell. The coupling coefficient α is decided by capacitive coupling ratio between the wire capacitance of the sub bit line SBL and the junction capacitance between the N type well region and the drain. For example, in the case where, VPnwell of the memory cell to be programmed is 6V and the coupling coefficient α=0.5 (capacitive ratio 1:1), the drain voltage of the memory cell to program is boosted to 3V. Assuming that Vcc=1.8V, the voltage between the source and the drain of the memory cell to program, becomes 1.8V. The voltage between the source and the drain of the non-programming memory cell becomes αVPnwell−Vcc=1.2V. In this way, it is possible to increase the drain voltage of the non-programming memory cell to 3V in a state where the voltage between the source and the drain of the memory cell to program is reduced.

Because the drain voltage depends on the coupling coefficient α and the voltage VPnwell of the N type well region at the time of programming, independent control of the drain voltage of a non-programming memory cell is comparatively difficult. Thereupon, alternative control method will be disclosed.

FIG. 6B is a timing diagram which shows a control method at the time of another programming operation in the present embodiment. The difference between the case of FIG. 6A is the drain voltage application method of the non-programming memory cell. FIG. 6B shows an operation at the time of programming the memory cell MCn0a in FIG. 4.

First, in the operation for programming the memory cell MCn0a, at the time t1, the word lines WL<0>, . . . , WL<n>, the source line SL and the N type well region are applied with the voltage Vcc. The selection gates SGa and SGb are set at 0V. The selected main bit line MBL0 is set at 0V in order to program "0" data into the memory cell MCn0a. All the other main bit lines MBL which are not to program "0" data are set at Vcc. At this time, because the selection transistors ST0a, ST1a, ST0b, ST1b . . . are all in an OFF state, all the sub bit lines SBL0a, SBL0b, SBL1a, SBL1b . . . are floated.

Next, at the time t2, the non-selected word lines WL<0>, . . . , WL<n−1> of the memory cell MCn0a drop from Vcc to VNuwl. The source line of the memory cell MCn0a is boosted from Vcc to VPinhibit. The N type well region of the memory cell MCn0a is boosted from Vcc to VPnwell. The non-selected word line WL level which is VNuwl of the memory cell MCn0a is set so that the memory cells along the non-selected word lines WL become all ON. At this time, the memory cell along the non-selected word lines WL are all ON.

At the time t3, the non-selected word lines WL<0>, . . . , WL<n−1> of the memory cell MCn0a are boosted from VNuwl to VPuwl. Because the word lines are boosted to VPuwl, the memory cells along the non-selected word lines are cut off. Then, at the time t4, the voltage of the source line SL drops from VPinhibit to Vcc. At the time t5, the selected word line WL<n> of the memory cell MCn0a is boosted from Vcc to VPwl. Further, at the time t6, the selection gate SGa of the memory cell MCn0a is boosted from 0V to Vcc. As a result, the selection transistor is ON. The voltage of the sub bit line SBL0a which is connected to the drain of the memory cell MCn0a which is to be programmed, becomes 0V On the other hand, the main bit line MBL1 of the memory cell MCn0a is Vcc. The selection transistor ST1a connected to the memory cell MCn1a is in an OFF state. As a result, the voltage of the sub bit line SBL1a selected by the selection gate SGa, is kept at VPinhibit. Following this, at the time t5, the word line of the memory cell MCn0a selected for programming becomes VPwl. At this time, the main bit line MBL0 of the drain voltage of the memory cell MCn0a selected for programming is at 0V. The source line SL of the memory cell MCn0a selected for programming is at Vcc. The N type well region of the memory cell MCn0a selected for programming becomes VPnwell. Therefore, in BTBT current which occurs near the drain of the memory cell MCn0a selected for programming, the electrons are accelerated toward the channel direction. Electrons are extracted toward the word line which is applied with the positive voltage VPwl. Consequently, the extracted electrons are injected into the floating gate. The programming operation of the memory cell MCn0a selected for programming is carried out as described above. Then, at the time t7, each of the voltages for programming are returned to their initial states.

In the present programming control, all of the drain voltages of the memory cell transistors MCn0b, MCn1a, MCn1b . . . which are not to be programmed, become the same level of VPinhibit. For example, in the case where Vcc=1.8V and VPinhibit=3.6V, the voltage between the source and drain of the memory cell to program becomes 1.8V. In this way, in this condition where the voltage between the source and drain of a non-programming memory cells is controlled to VPinhibit−Vcc=1.8V, it is possible to increase the drain voltage of the non-programming memory cells to 3.6V. The drain voltage of the non-programming memory cells is maintained at a fixed voltage of VPinhibit which is generated by an internal charge pump. As a result, in the present control method, controllability is superior to in the case where voltage is boosted and supplied by capacitive coupling between the N type well region and the drain of a memory cell.

Figure 7:
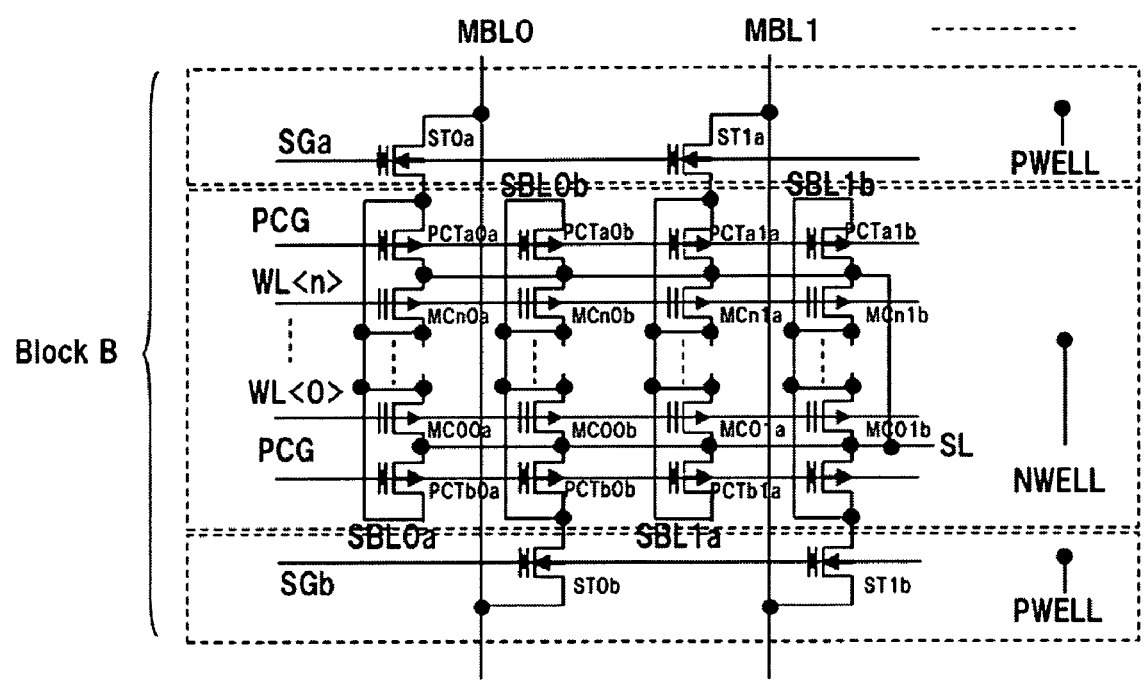
FIG. 7 is a circuit diagram which shows one block of a non volatile semiconductor memory device in another embodiment of this invention.

Next, the non-volatile semiconductor memory device related to the second embodiment will be explained by referring to FIG. 7 to FIG. 9. The block diagram of the semiconductor memory device of the second embodiment is the same as the one in FIG. 4B. FIG. 7 is a circuit diagram which shows one block of the non-volatile semiconductor memory device of this embodiment. FIG. 7 shows an embodiment with two rows of pre-charging transistors PCTs (PCTa0a, PCTa0b, PCTa1a ... and PCTb0a, PCTb0b, PCTb1a ...), however the plurality of P type pre-charging transistors PCTs may be arranged along one end of the NWELL (only PCTa0a, PCTa0b, PCTa1a ...; and PCTb0a, PCTb0b, PCTb1a ... may be omitted).

Figure 8A:
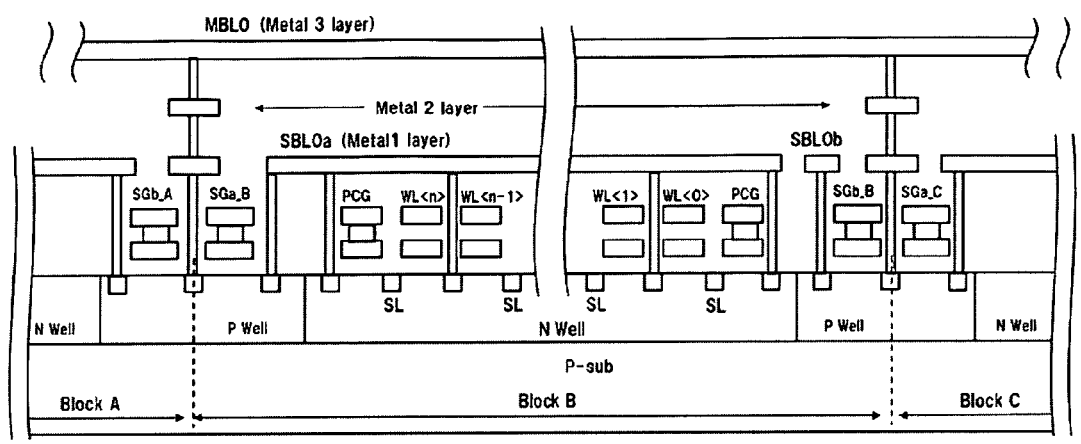
FIG. 8A is a cross sectional drawing in a bit line direction another embodiment of this invention.

FIG. 8A is cross sectional drawing along a bit line direction of the non-volatile semiconductor memory device of this embodiment. Plural arrays of pre-charging transistors (P channel type transistor) are arranged to sandwich the word lines WL<0>, ..., WL<n>, which is different from the first embodiment. The memory cell transistors MC00a, ..., MCn0a, MC00b, ..., MCn0b, MC01, ..., MCna, MC01b, ..., MCn1b, ... are P channel type transistors (each may be with a floating gate, but it could be with a nano-crystal or silicon nitride charge accumulation layer) formed in an N type well region 12. The selection transistors ST0a, ST1a, ST0b, ST1b, ..., are N channel type transistors formed in P type well region 13 or 14. Also, two blocks (N type wells) which are adjacent in a bit direction, according to the present embodiment, share a P type well region where selection transistors are formed. As a result, the area which is occupied by the whole non-volatile semiconductor memory device is reduced. In the present embodiment, selection gates of the pre-charging transistor PCG are arranged at both the top and bottom ends of a block as shown in FIG. 7. The selection gate PCG of these pre-charging transistors PCG are electrically shorted, only one row may be placed instead of both rows. As shown in FIG. 8A, in order to reduce a formation of a step between a memory cell region and PCT region, the pre-charging transistors PCT and the selection transistors ST0a, ST1a, ST0b, ST1b, ... have the same double poly construction as a memory cell. By shorting a control gate and a floating gate through a via-hole, the resultant structure is essentially the same as a single poly (one layer) transistor. However, when the memory cell has a nano-crystal or a silicon nitride charge accumulation layer, then the selection transistors and the pre-charging transistors should be single gate transistors. Within one block, two sub bit lines SBL0a, SBL1a are connected to one main bit line MBL0, MBL1, .... Further, in the present embodiment, while two sub bit lines SBL0a, SBL1a are connected to one main bit line MBL0, MBL1, the present embodiment is not limited to this. For example, the essential effects of this invention can be obtained even with one or four sub bit lines for a main bit line.

Figure 8B:
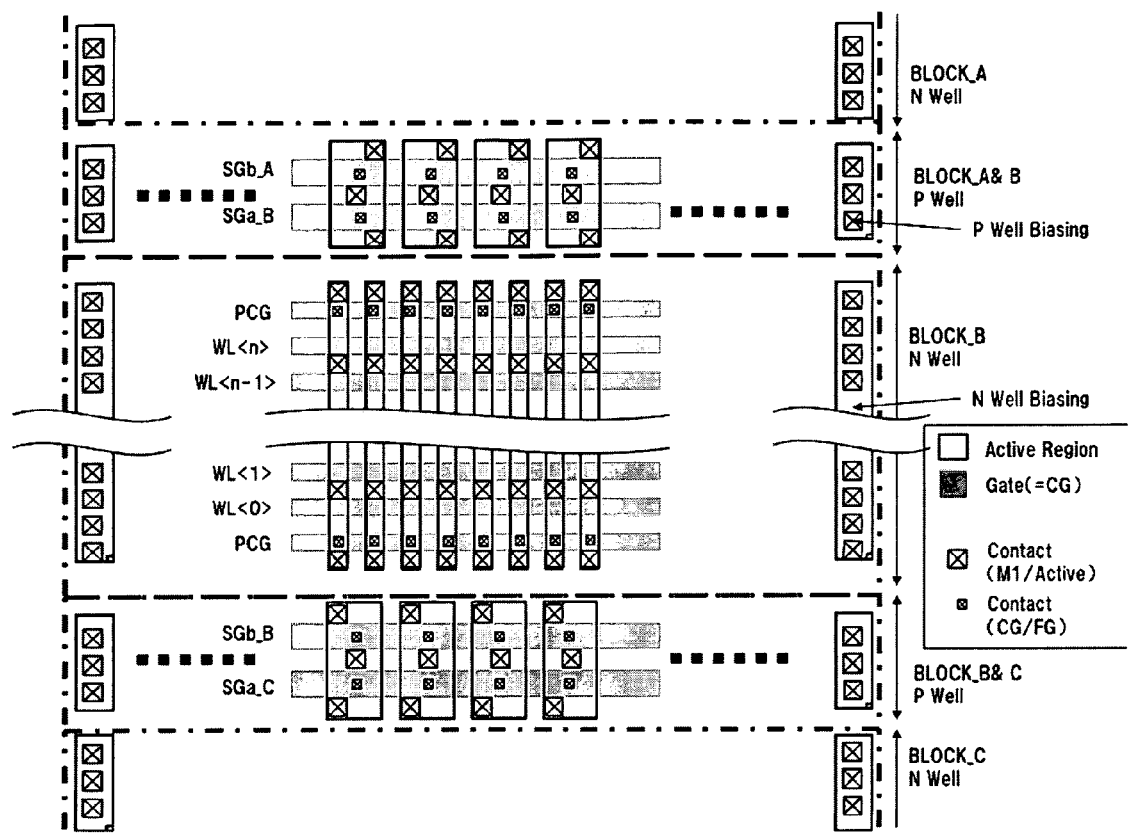
FIGS. 8B and 8C show a pattern layout of the memory cell array.
Figure 8C:
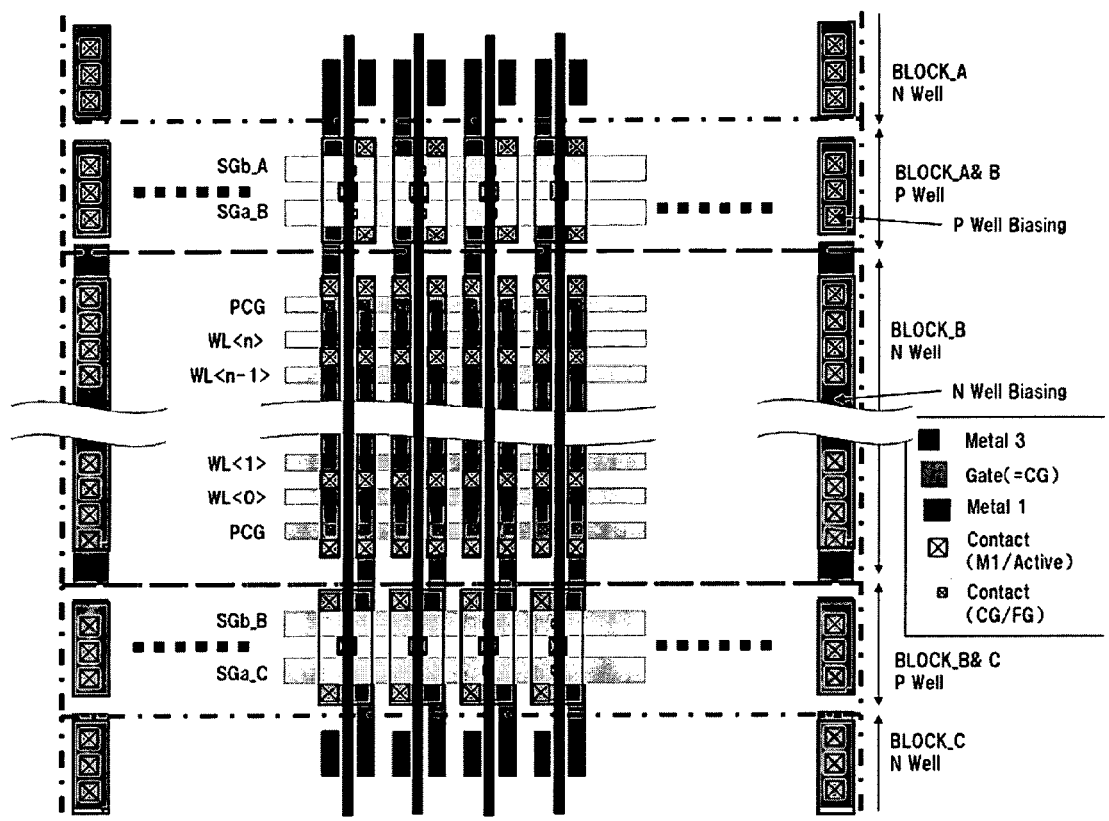

FIGS. 8B and 8C are plan view of the layout of patterns. Also in the second embodiment, it is preferred to have the local interconnections as described in FIG. 5D.

Further, as is shown in FIG. 8A, in the present embodiment, in the memory cells MC00a, ..., MCn0a, MC00b, ..., MCn0b, MC01a, ..., MCna, MC01b, MCn1b ... floating gates are formed on insulation layers above the channel regions. The word lines WL<0>, ..., WL<n> which are control gates, are formed above these floating gates. In addition, in the present embodiment, floating gates are formed on insulation layers above the channel regions of the selection transistors ST0a, ST1a, ST0b, ST1b .... Further, the selection gates SG1A, SG0B, SG1B, SG0C, ... which also are control gates, are formed above the floating gates. Here, as stated above, the floating gates and selection gates in the selection transistors ST0a, ST1a, ST0b, ST1b are electrically connected.

Figure 9A:
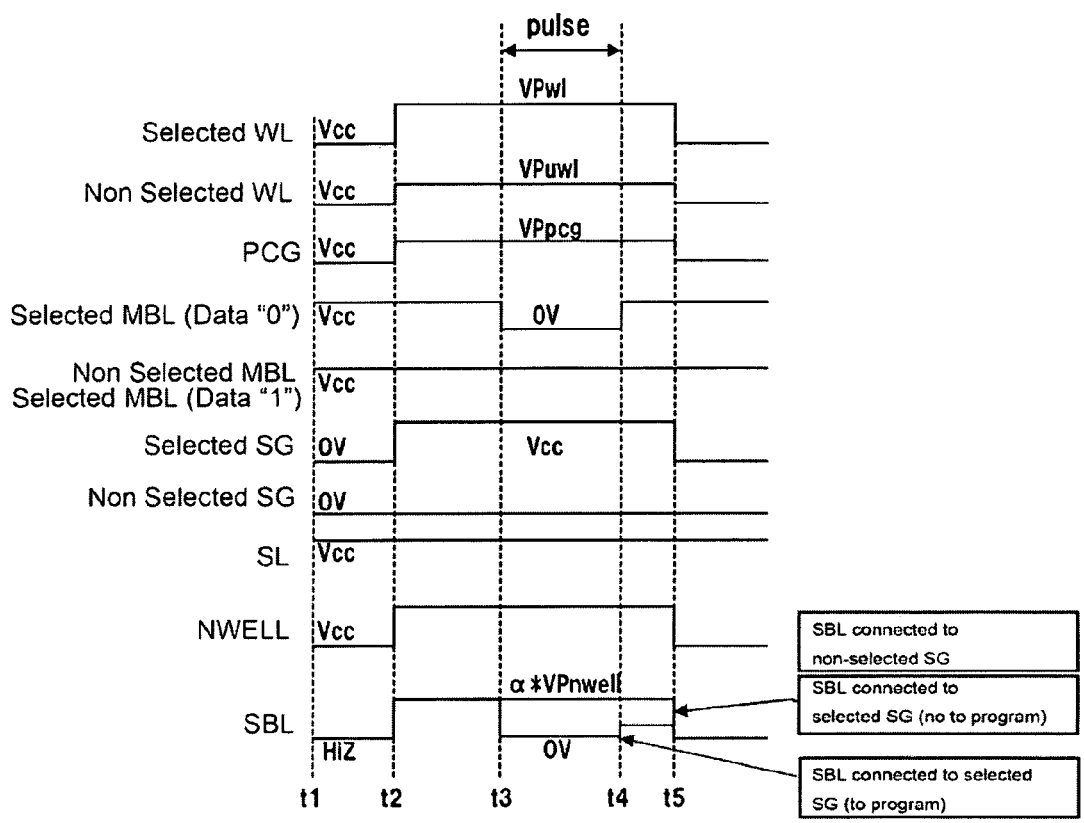
FIGS. 9A and 9B are timing diagrams which show programming operations in the second embodiment of the present invention.

Next, a timing control at the time of programming in the present embodiment is shown in FIG. 9A. Here, FIG. 9A shows an operation for programming the memory cell MCn0a described in FIG. 7.

At the time t1, the word lines WL<0>, ..., WL<n>, the bit lines MBL0, MBL1, ..., the source line SL, the N type well region and the selection gate PCG of the pre-charging transistors are applied with Vcc. The selection gates SGa, SGb are set at 0V. At this time, the selection transistors ST0a, ST1a, SBL1a, SBL1b, ... are all in an OFF state. All the sub bit lines SBL0a, SBL0b, SBL1a, SBL1b are floated.

At the time t2, the selected word line WL<n> of the memory cell MCn0a is boosted to VPwl from Vcc. The non-selected word lines WL<0>, ..., WL<n−1> are boosted from Vcc to VPuwl. The N type well region of the memory cell MCn0a is boosted from Vcc to VPnwell. Also, the selection gate SGa of the memory cell MCn0a is similarly boosted from 0V to Vcc. The selection gate PCG of the pre-charging transistor is boosted from Vcc to VPpcg. At this time, the selection transistors ST0a, ST1a, ... along the selection gate SGa are ON. As a result, the potential of the sub bit lines SBL0a, SBL1a becomes Vcc-Vthn. The potential of the sub bit lines SBL0a, SBL1a is at a value dropped only by the threshold voltage Vthn of a selection transistor from Vcc of the potential of the main bit lines MBL0, MBL1. Then, it becomes αVPnwell by capacitive coupling (α is a coupling coefficient). On the other hand, the sub bit lines SBL0b, SBL1b are connected to the selection transistors ST0b, ST1b, ... along the selection gate SGb. The potentials of the sub bit lines SBL0b, SBL1b are boosted by capacitive coupling between the N type well region and the drain of a memory cell. Here, when the coupling coefficient is α, the potential becomes at a value where VPnwell is multiplied by α, (αVPnwell). The voltage VPuwl of the non-selected word line WL and the voltage VPpcg of the selection gate of the pre-charging transistor are set so that the memory cell along the non-selected word line WL and the pre-charging transistor PCG do not turn ON.

Then, in the time t3, the potential of the main bit line MBL0 supplied with "0" data. The potential of the main bit line which is to be programmed drops from Vcc to 0V. As a result, the potential of the sub bit line SBL0 becomes 0V. Here, the sub bit line SBL0 is connected to the drain of the memory cell MCn0a which is to be programmed. At this time, the word line of the memory cell MCn0a which is selected for programming becomes to be at VPwl. The drain of the memory cell MCn0a becomes 0V. The source line SL becomes to be at Vcc. The N type well region of the memory cell Mcn0a which is selected for programming is at VPnwell. Therefore, in the BTBT current which occurs nears the drain of the memory cell MCn0a, electrons are accelerated toward a channel direction. The accelerated electrons are extracted toward the word line which is applied with a positive voltage VPwl. The extracted electrons are injected into a floating gate. The programming operation of a memory cell MC0na is carried out as stated above. Then, at the time t4, the programming operation is completed by the returning of the main bit line MBL0 voltage to Vcc. At the time t5, each voltages are returned to their initial states.

In the present embodiment, all the drain voltages of the memory cells MCn0b, MCn1a, Mcn1b ... which are not to be programmed become at the same αVpnwell. The coupling coefficient α is determined by the ratio between the wire capacitance of the sub bit line SBL and the drain coupling capacitance of the N type well region. For example, when VPnwell=6V, coupling coefficient α=0.5 (capacitance ratio 1:1), the voltage of a memory cell not to be programmed rises to 3V. When Vcc=1.8V for example, the voltage between the source and drain of a memory cell to be programmed becomes at 1.8V and the voltage between the source and drain of a non-programming memory cell becomes αVpnwell−Vcc=1.2V. In this way, it is possible to increase the drain voltage of a non-programming memory cell to 3V while the voltage between the source and drain is reduced.

In the present embodiment, because the drain voltage depends on the coupling coefficient α and the voltage VPnwell of the N type well region at the time of programming, independent control of the drain voltage of a non-programming memory cell is comparatively difficult. Thereupon, alternative control method will be disclosed.

Figure 9B:
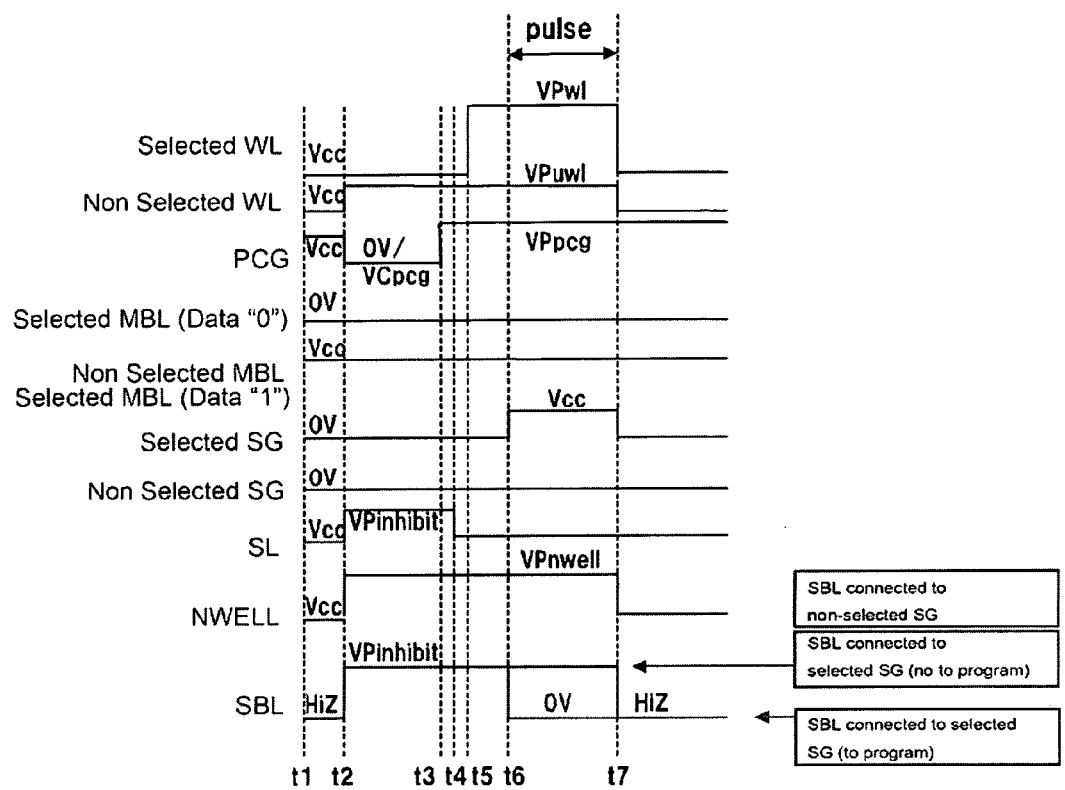

FIG. 9B is a timing diagram which shows another control method for programming in the second embodiment. What are different from the case in FIG. 9A is the application method of a drain voltage of a non-programming memory cell. FIG. 9B shows the operation at the time of programming the memory cell MCn0a in FIG. 7.

First, the word lines WL<0>, . . . , WL<n>, source line SL, N type well region and the selection gate PCG of the transistor for pre-charging are all applied with Vcc, at the time t1. In addition, the selection gates SGa and SGb are set at 0V. All the other main bit lines MBL which are not to be programmed are set at Vcc. At this time, the selection transistors ST0a, ST1a, ST0b, ST1b . . . are all in an OFF state. All the sub bit lines SBL0a, SBL0b, SBL1a, SBL1b are floated.

Next, at the time t2, the selection gate PCG of the pre-charging transistor connected to the memory cell MCn0a drops from Vcc to 0V. The non-selected word lines WL<0>, . . . , WL<n−1> of the memory cell MCn0a rises from Vcc to VPuwl. The source line SL rises from Vcc to VPinhibit. The N type well region of the memory cell MC0na rises from Vcc to VPnwell. At this time, the pre-charging transistor is turned ON. As a result, the voltage of all the sub bit lines SBL0a, SBL1a, . . . are charged to the same voltage, VPinhibit, as the source line SL voltage. Also, the voltage VPuwl of the non-selected word line WL is set so that the cell above the non-selected word line WL is not switched ON by the drain voltage VPinhibit. After this, at the time t3, the selection gate PCG of the pre-charging transistor rises from 0V to VPpcg. The selection gate PCG of the transistor for pre-charging rises to VPpcg so that PCTr is cut OFF. Further, in the present embodiment, at the time t2, the selection gate PCG of the transistor for pre-charging drops from Vcc to 0V. In the case where the voltage difference is insufficient, the selection gate PCG of the transistor for pre-charging is changed to about Vcc−2V.

At the time t4, the voltage of the source line SL drops from VPinhibit to Vcc. At the time t5, the selected word line WL<n> of the memory cell MC0na rises from Vcc to VPwl. Further, at the time t6, the selection gate SGa of the memory cell MC0na rises from 0V to Vcc. As a result, the voltage of the sub bit line SBL0a becomes 0V. Further, the selection transistor is turned ON. The sub bit line SBL0a is connected to the drain of the memory cell MCn0a.

On the other hand, the main memory bit line MBL1 of the memory cell MCn1a is Vcc. The selection transistor ST1a of the memory cell MCn1a is in an OFF state. As a result, the voltage of the sub bit line SBL1a which is not to be programmed and which is selected by the selection gate SGa is stored at VPinhibit. Then, at the time t5, the word line of the programming selected memory cell MCn0a becomes VPwl. At this time, the main bit line MBL0 of the drain voltage of the programming selected memory cell MCn0a is 0V. The source line SL of the programming selected memory cell MCn0a is Vcc. The N type well region of the programming selected memory cell MCn0a becomes VPnwell. Therefore, in the BTBT current, electrons generated in the area near the drain of the memory cell MCn0a are accelerated toward the direction of the channel. Electrons are extracted toward the word line applied with the positive voltage VPwl. As a result, the extracted electrons are injected into the floating gate. The programming operation of a memory cell MC0na is performed as stated above. Then at the time t7, each of the voltages returns to its initial state.

In the present control method, the drain voltages of the memory cell transistors MCn0b, MCn1a, MCn1b . . . are the same VPinhibit. For example, in the case where Vcc=1.8V and VPinhibit=3.6V, the voltage between the source and drain of the memory cell to program becomes 1.8V. In this way, it is possible to increase the drain voltage of a non-programming memory cell up to 3.6V while the voltage between the source and drain of the non-programming memory cell is controlled to VPinhibit−Vcc=1.8V. The drain voltage of the non-programming memory cell is maintained at a fixed voltage of VPinhibit which is generated by an internal charge pump. As a result, in the present control method, controllability is superior to in the case where voltage is boosted and supplied by capacitive coupling between the N type well region and the drain of a memory cell.

Furthermore, a floating gate is used in the memory cell transistor in each of the above stated embodiments, however, the present invention is not limited to this. For example, instead of a floating gate, the effects of the present invention can be exhibited by using a charge accumulation layer of a nano crystal layer or a silicon nitride layer.

Figure 10:
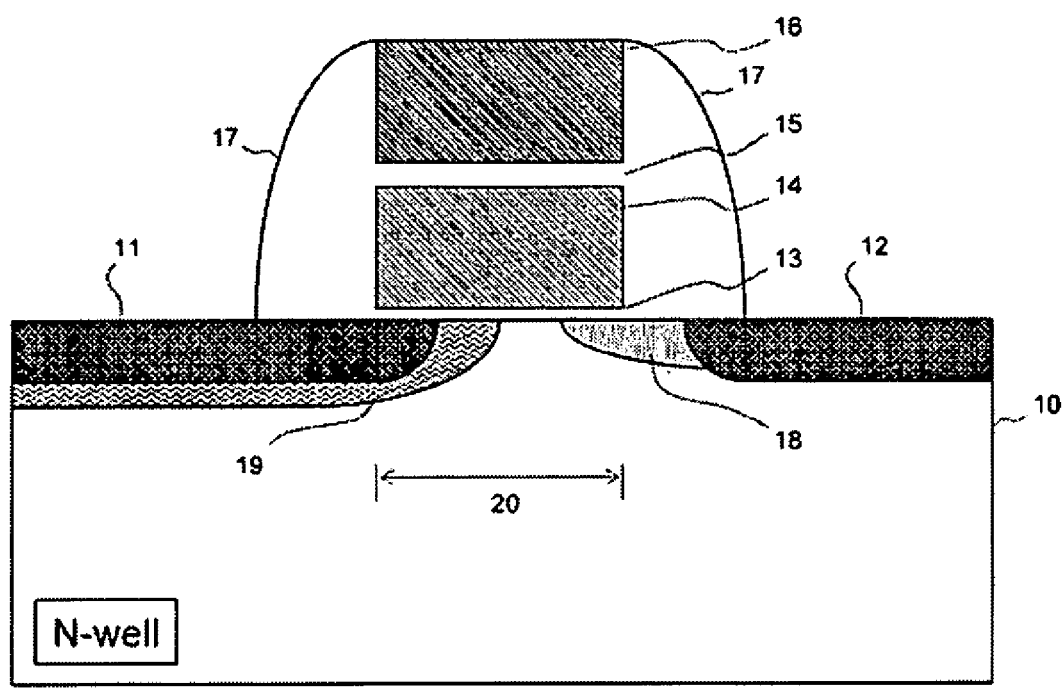
FIG. 10 is a drawing which shows the structure of a memory cell transistor in a nonvolatile semiconductor memory device of this invention.

Here, the construction of the memory cell transistor which is applied in a non volatile semiconductor memory device stated in the above embodiments will be explained by referring to FIG. 10. In FIG. 10, a memory cell transistor is formed in the N type well region which is formed on the P type semiconductor substrate. Near the main surface of the substrate a drain 11 and a source 12 are formed with P+ regions. A floating gate 14 is formed on the substrate between this drain 11 and source 12 and on an insulation layer 13, and a control gate 16 is formed above an insulation layer 15. The region where these stacked insulation layer 13, floating gate 14, and insulation layer 15, and control gate 16 are formed on the main surface of the substrate is defined as a channel region 20. In addition, a side wall 17 is formed on the drain side 11 and the source side 12 of these stacked insulation layer 13, floating gate 14, insulation layer 15 and control gate 16.

In order to make the programming (electron injection) of the floating gate 14 by BTBT easily, unbalance in diffusions between the drain side 11 and the source side 12 is made. Since programming is made more difficult on the side of the source 12, this memory cell transistor is constructed to exhibit the following characteristics.

(1) The drain 11 is formed well inside the part of the channel region 20. The drain 11 overlaps with the floating gate 14. On the other hand the source 12 is formed near the side wall 17. The source 12 does not overlap with the floating gate 14. It becomes more difficult for electrons to be injected into the floating gate 14 from the source side 12.

(2) A region with a low impurity concentration 18 (Lightly Doped Drain) is arranged on the end of the side of the channel region on the source side 12. The electric field near the source side 12 is eased and it becomes more difficult for BTBT to occur near the source side 12.

(3) Rather than the N type well 10, A "Halo layer" 19 which is an N type region with a high concentration of impurities is formed at the joining part of the N type well 10 and the drain side 11. The electric field near the drain side 11 becomes stronger and it becomes easier for BTBT hot electron injection to occur near the drain 11.

The memory cell transistor which is shown in FIG. 10 is arranged with all the characteristics stated in (1), (2), and (3) above, however, if at least one of these characteristics is arranged in the memory cell transistor it is possible to unbalance the ease of programming to the floating gate 14 by BTBT between the drain side 11 and the source side 12.

Figure 11A:
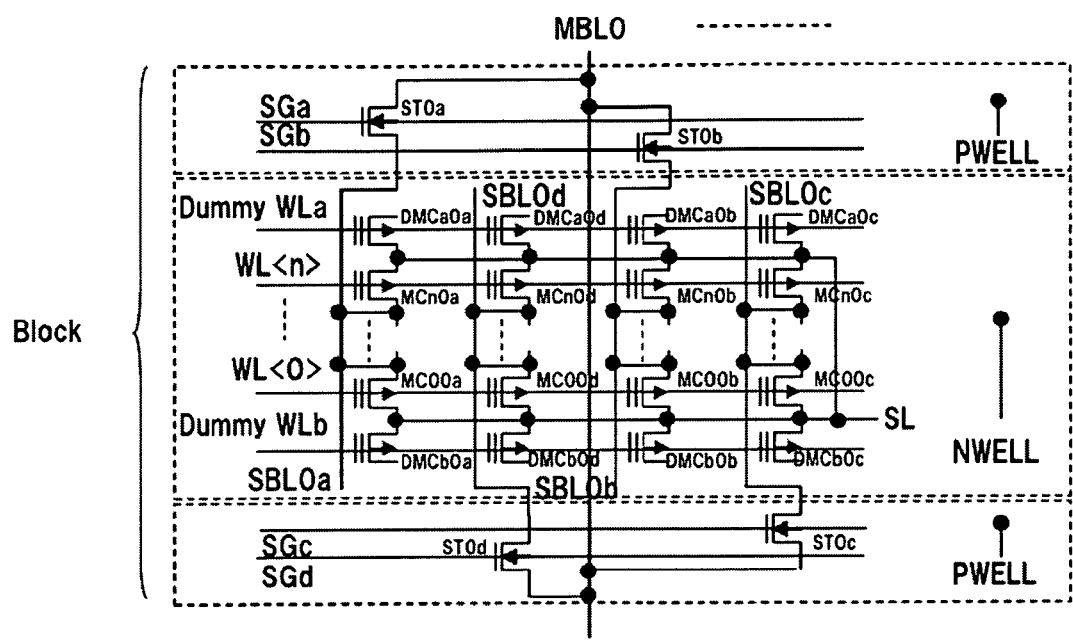
FIG. 11A shows a circuit diagram of a modification of the first embodiment without pre-charging transistors.
Figure 11B:
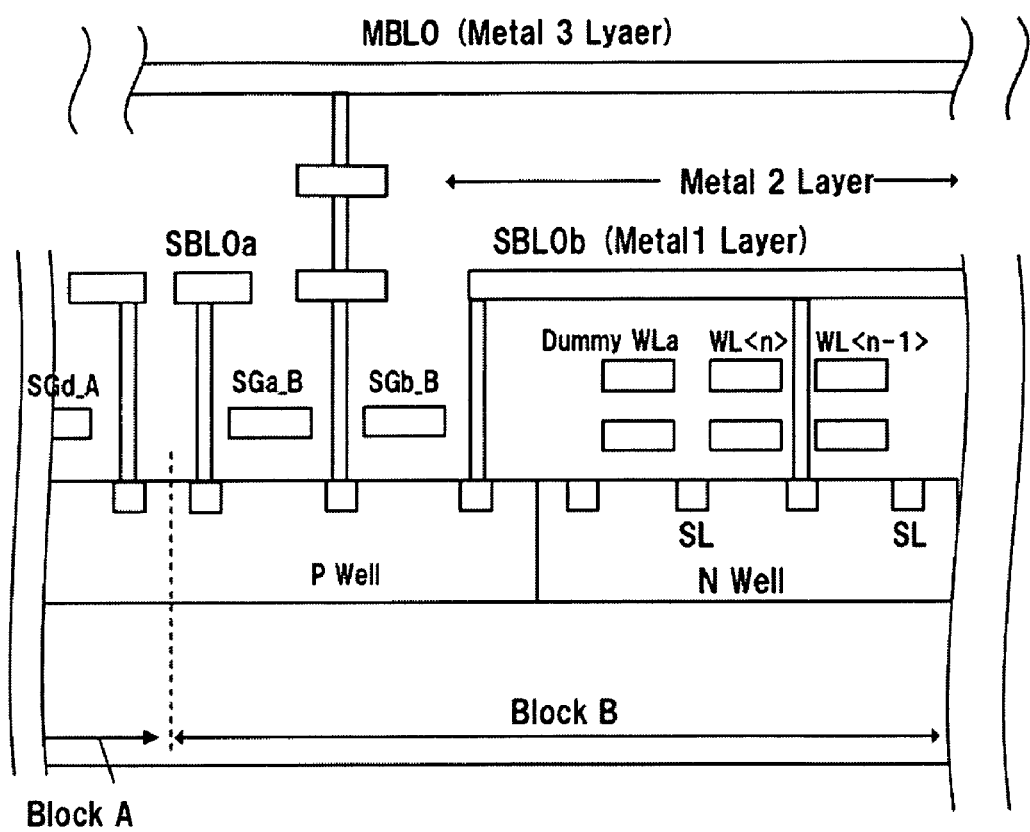
FIG. 11B shows a cross sectional view of the memory cell array and selection transistors.
Figure 11C:
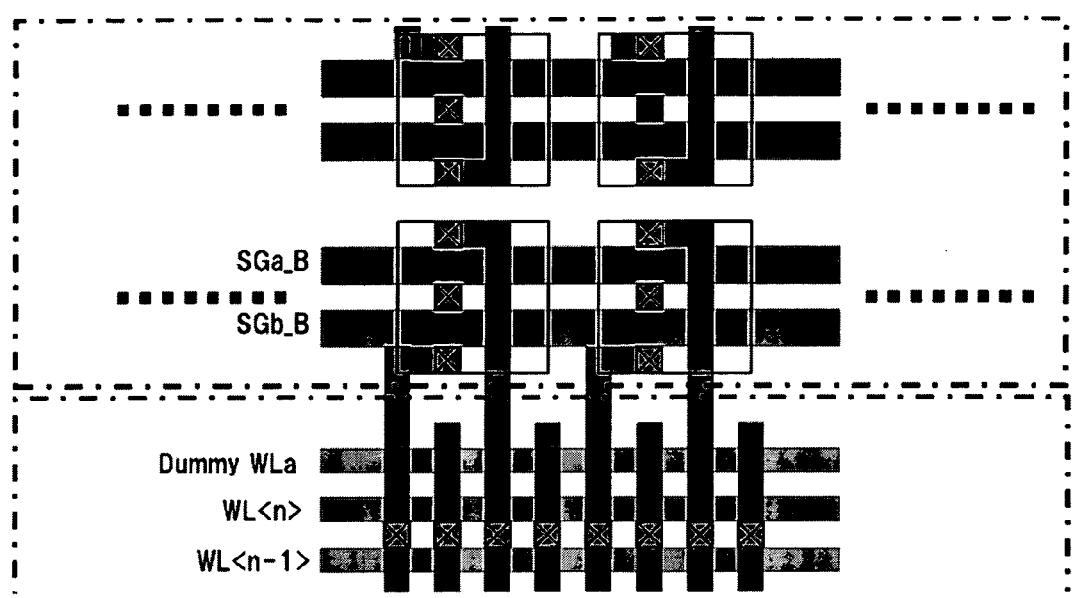
FIG. 11C shows pattern layout thereof.

In the above mentioned embodiments, two sub bit lines are connected to a single main bit line, however it can be modified to be of four sub bit lines connected to a single main bit line. FIG. 11A shows a circuit diagram of a modification of the first embodiment without pre-charging transistors. FIG. 11B shows a cross sectional view of the memory cell array and selection transistors, and FIG. 11C shows pattern layout thereof.

Figure 12A:
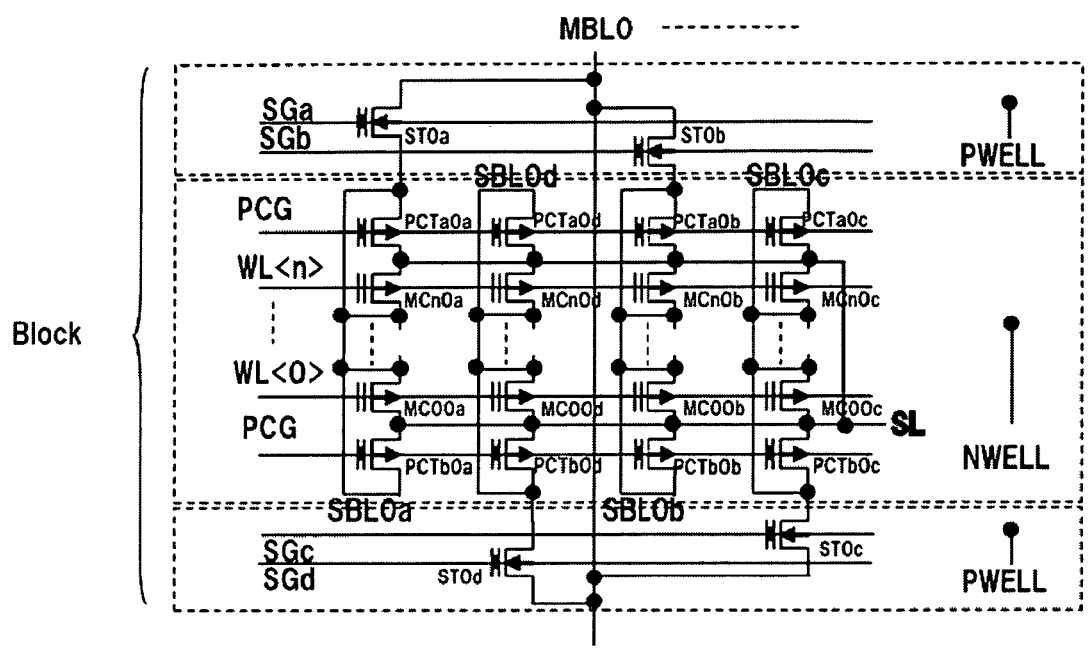
FIG. 12A shows a circuit diagram of a modification of the second embodiment with pre-charging transistors.
Figure 12B:
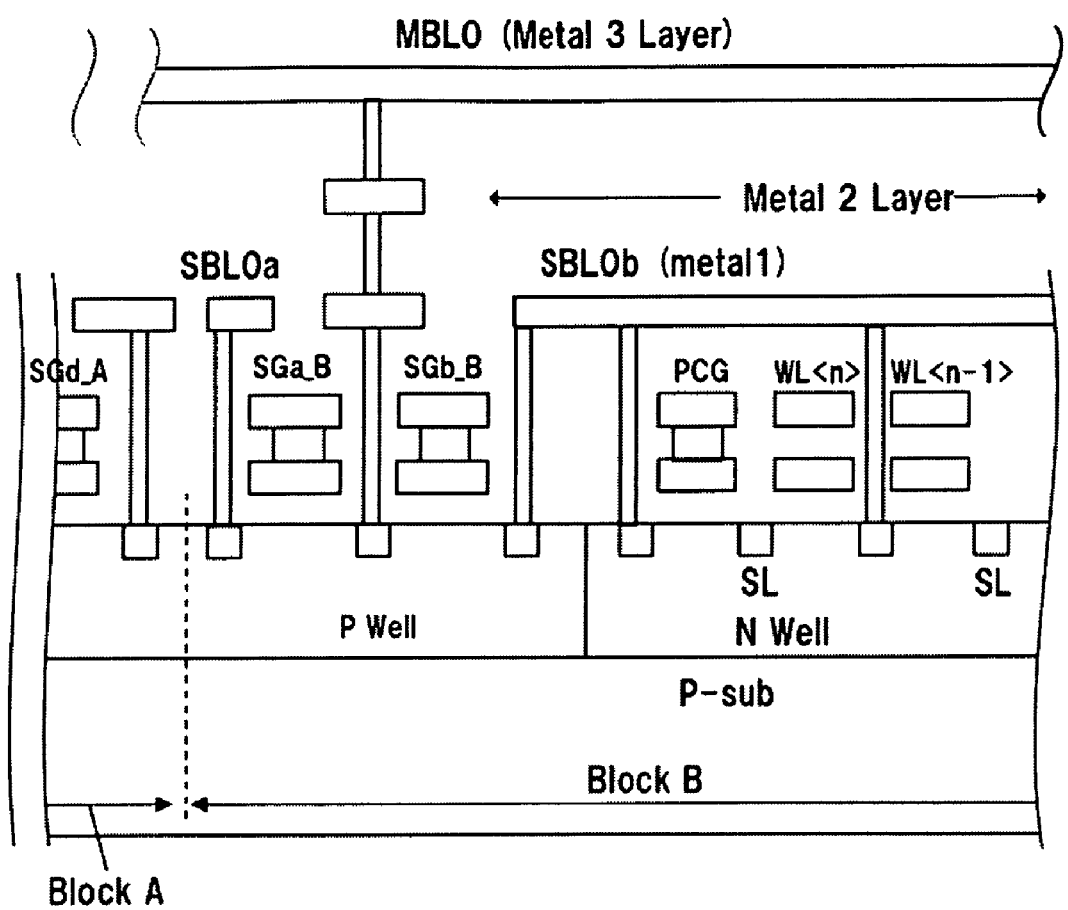
FIG. 12B shows a cross sectional view of the memory cell array and selection transistors.
Figure 12C:
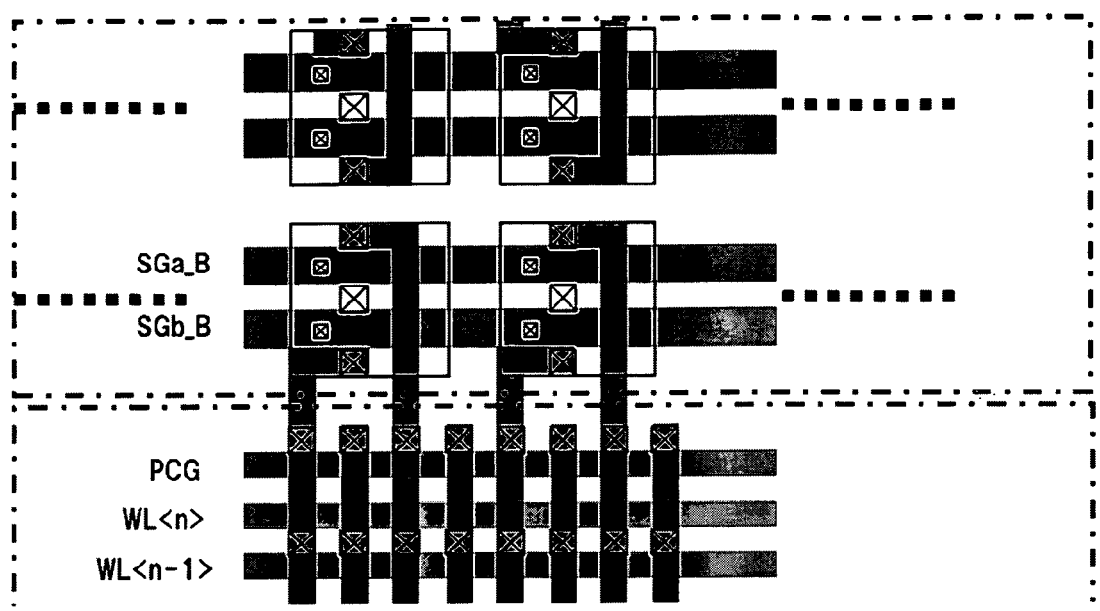
FIG. 12C shows pattern layout thereof.

FIG. 12A shows a circuit diagram of a modification of the second embodiment with pre-charging transistors. FIG. 12B shows a cross sectional view of the memory cell array and selection transistors, and FIG. 12C shows pattern layout thereof. The width of the gate of selection transistors is greater than the width of gates of memory cells, which makes the operation margin better. When four sub bit lines are connected to a single main bit line, the width of the gate of selection transistors can be greater than the case where two sub bit lines are connected to a single main bit line. Two selection gates for different sub bit lines (SBL0*a* and SBL0*b*) share the sources to provide a single contact to main bit line. Local interconnection for well biasing may be applied to.

FIGS. 13A to 14C show alternative examples of connections between the first poly silicon layer and the second poly silicon layer of pre-charging transistors (PCG) and selection transistors (SG).

Figure 13A:
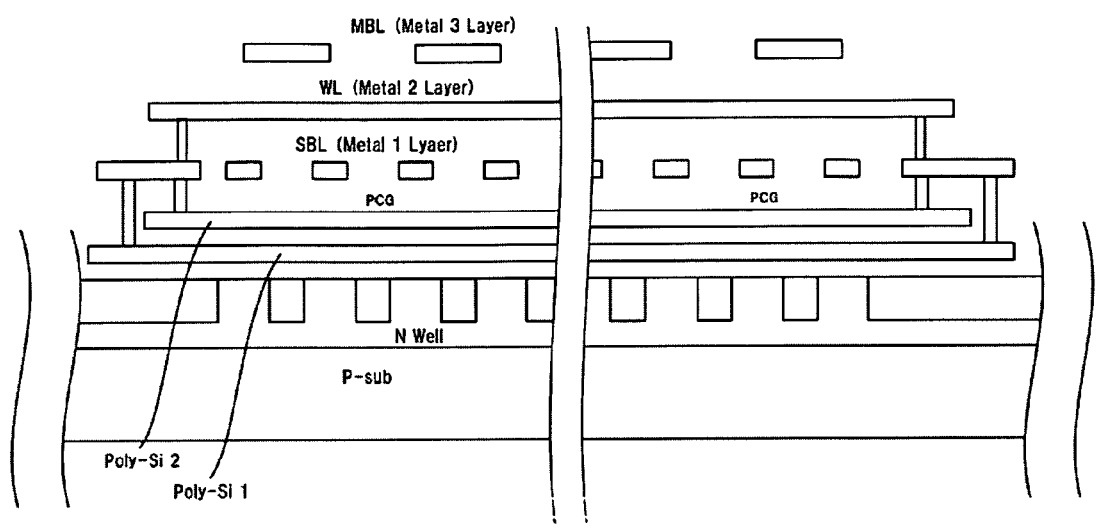

FIG. 13A is one example of poly to poly connection viewed by a cross section along the word line direction. As shown in FIG. 13A, the first poly silicon layer and the second poly silicon layer can be connected at the end of the lines by using the first metal layer (same as SBL). PCG is strapped with the second metal layer which is similar to WLs. The configuration described in FIG. 13A has an advantage that fine patterning and additional processes are not necessary.

Figure 13B:
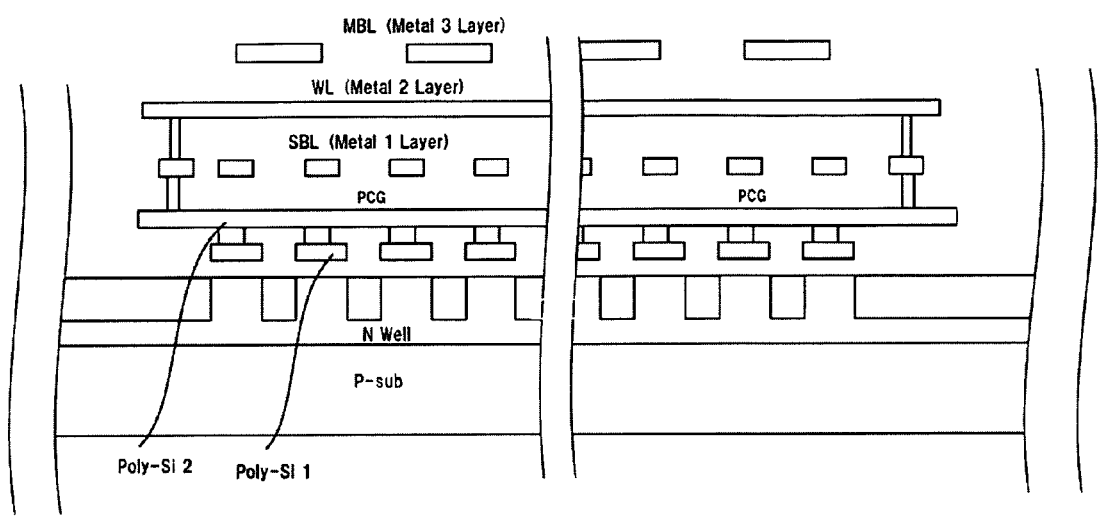

FIG. 13B is another example of poly to poly connection viewed by a cross section along the word line direction. As shown in FIG. 13B, each of the pre-charging transistors has a patterned first poly gate which is pattered in similar manner as of memory cells. Each of the patterned first poly gates is electrically connected to the second elongated poly silicon layer through via hole formed on the first poly gate. PCG is strapped with the second metal layer which is similar to WLs. The configuration described in FIG. 13B has an advantage that the separation of first poly silicon film is easy because the similar pattern can be used for both memory cells, pre-charging transistors and selection transistors.

Figure 14A:
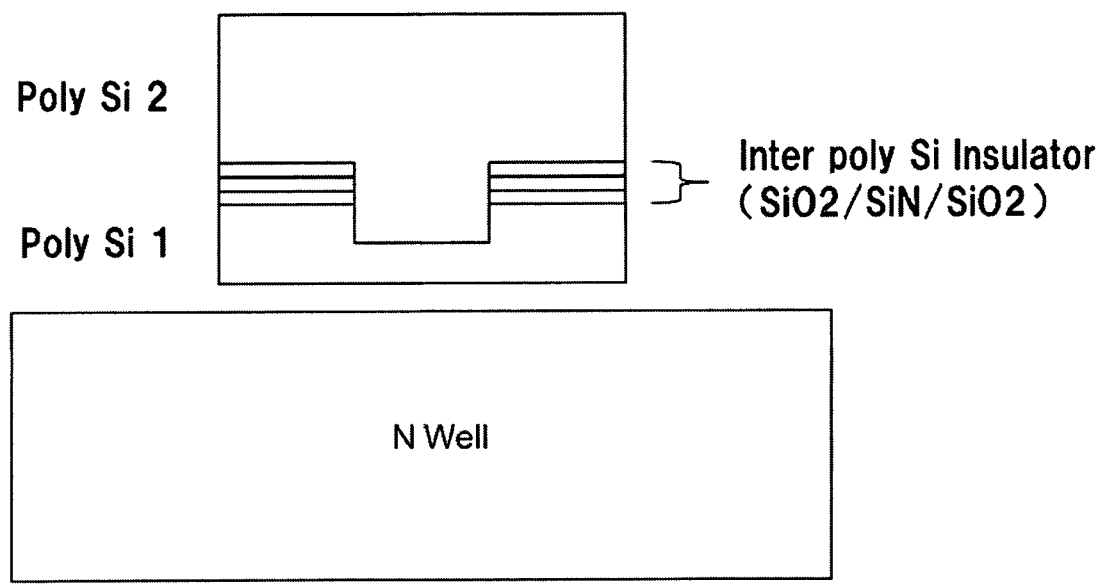

FIG. 14A is one example to connect the second poly layer and the first poly layer. As shown in FIG. 14A, the center of inter poly silicon insulator film is removed to provide a via hole.

Figure 14B:
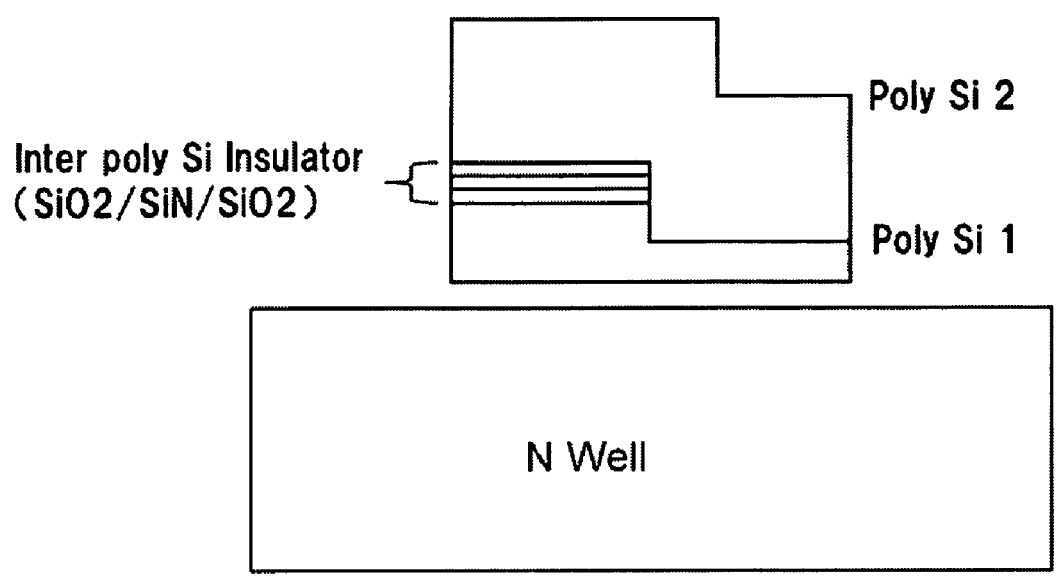

FIG. 14B is another example to connect the second poly layer and the first poly layer. As shown in FIG. 14B, the half of inter poly silicon insulator film is removed to provide a via hole.

Figure 14C:
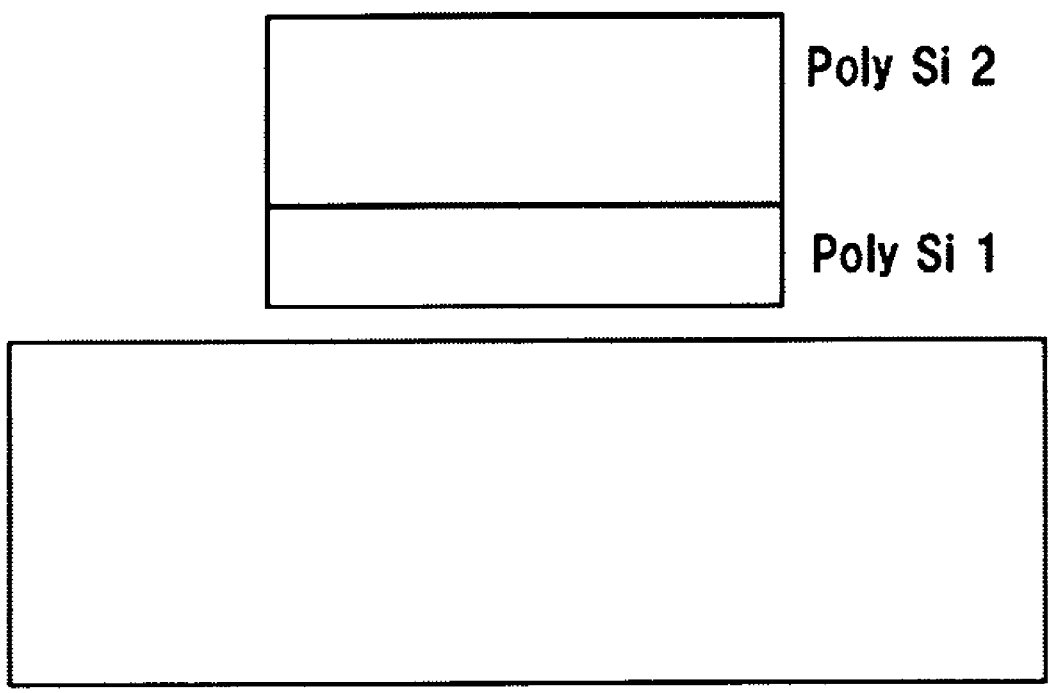

FIG. 14C is still another example to connect the second poly layer and the first poly layer. As shown in FIG. 14C, the whole inter poly silicon insulator film is removed to provide an electrical connection.

We claim:

1. A non-volatile semiconductor memory device comprising:
    a P type non-volatile memory cell formed in an N type well, said P type non-volatile memory cell including a source, a drain, a charge accumulation layer and a control gate;
    a sub-bit line physically directly connected to said drain of said P type non-volatile memory cell;
    an N type selection transistor including a source, a drain and a control gate, said drain of said N type selection transistor being physically directly connected to said sub-bit line;
    a well bias circuit to bias said N type well with a first voltage so that said sub-bit line is floated and boosted to a program inhibit voltage by a capacitive coupling between said N type well and said drain of said P type non-volatile memory cell; and
    wherein, said P type non-volatile memory cell is programmed by applying a word line voltage to said control gate of said P type non-volatile memory cell and by applying a programming voltage to said source of said N type selection transistor, so that said sub-bit line is discharged to said programming voltage by said N type selection transistor.

2. The non-volatile semiconductor memory device according to claim 1 wherein, during programming of said P type non-volatile memory cell electrons are injected from said drain of said P type non-volatile memory cell into said charge accumulation layer of said P type non-volatile memory cell.

3. The non-volatile semiconductor memory device according to claim 2 wherein said source of said P type non-volatile memory cell is biased with Vcc which is an externally supplied power supply voltage and said first voltage is internally generated by a charge pump circuit from said Vcc.

4. The non-volatile semiconductor memory device according to claim 1 wherein said N type selection transistor is formed in a P type well, and said N type well and said P type well are arranged adjacent to each other.

5. The non-volatile semiconductor memory device according to claim 1, wherein said charge accumulation layer of said P type non-volatile memory cell is made of nano-crystal layer or silicon nitride layer.

6. The non-volatile semiconductor memory device according to claim 1, wherein:
    said P type non-volatile memory cell includes a floating gate; and
    said N type selection transistor includes:
        a first gate which is the same layer as said floating gate; and
        a second gate which is the same layer as said control gate,
        wherein said first gate and said second gate are electrically connected through a via hole.

7. The non-volatile semiconductor memory device according to claim 1, wherein said drain and said source of said P type non-volatile memory cell are configured asymmetrically so that electron injections to said charge accumulation layer are different at said drain than at said source.

8. The non-volatile semiconductor memory device according to claim 7, wherein said drain includes a first diffusion region and said source includes a second diffusion region, the diffusion concentration of said first diffusion region being greater than that of said second diffusion region.

9. The non-volatile semiconductor memory device according to claim 1, further comprising;
a word line bias circuit configured to provide a second voltage to a word line, which is connected to said control gate of said P type non-volatile memory cell.

10. The non-volatile semiconductor memory device according to claim 1, wherein;
said N type well is biased by an N well bias voltage though a first number (N1) of contacts;
a P type well in which said N type selection transistor is formed is biased by a P well bias voltage though a second number (N2) of contacts; and
the first number (N1) is greater than the second number (N2).

11. The non-volatile semiconductor memory device according to claim 1, wherein said N type selection transistor is configured with a gate width that is wider than a width of the gate of said P type memory cell.

12. The non-volatile semiconductor memory device according to claim 1, wherein said N type selection transistor is an N type MIS transistor formed in a P type well.

* * * * *